United States Patent
Dueweke

(10) Patent No.: US 10,491,159 B2
(45) Date of Patent: Nov. 26, 2019

(54) SELF-TUNING MICROELECTROMECHANICAL IMPEDANCE MATCHING CIRCUITS AND METHODS OF FABRICATION

(71) Applicant: Michael J. Dueweke, Campbell, CA (US)

(72) Inventor: Michael J. Dueweke, Campbell, CA (US)

(*) Notice: Subject to any disclaimer, the term of this patent is extended or adjusted under 35 U.S.C. 154(b) by 112 days.

(21) Appl. No.: 15/691,948

(22) Filed: Aug. 31, 2017

(65) Prior Publication Data

US 2018/0069507 A1  Mar. 8, 2018

Related U.S. Application Data

(60) Provisional application No. 62/384,657, filed on Sep. 7, 2016.

(51) Int. Cl.

| | | |
|---|---|---|
| H03H 7/40 | (2006.01) |
| H03B 5/36 | (2006.01) |
| B81B 3/00 | (2006.01) |
| B81C 99/00 | (2010.01) |
| H03H 7/38 | (2006.01) |
| G01C 19/5755 | (2012.01) |

(Continued)

(52) U.S. Cl.
CPC ............ H03B 5/364 (2013.01); B81B 3/0051 (2013.01); B81B 3/0086 (2013.01); B81C 99/003 (2013.01); G01C 19/5755 (2013.01); H01L 23/642 (2013.01); H01L 28/60 (2013.01); H03H 7/38 (2013.01); H03H 7/40 (2013.01)

(58) Field of Classification Search
CPC .......... H03H 7/38; H03H 7/40; B81B 3/0051; H01L 23/64

USPC .................................................. 333/17.3, 32
See application file for complete search history.

(56) References Cited

U.S. PATENT DOCUMENTS

| | | |
|---|---|---|
| 3,723,882 A | 3/1973 | Carlson |
| 5,959,516 A | 9/1999 | Chang et al. |

(Continued)

OTHER PUBLICATIONS

International Preliminary Report on Patentability dated Mar. 21, 2019, PCT International Application No. PCT/US2017/049615; 7 pages; The International Bureau of WIPO, Geneva, Switzerland.

(Continued)

*Primary Examiner* — Stephen E. Jones
(74) *Attorney, Agent, or Firm* — Andrew D. Fortney; Central California IP Group, P.C.

(57) ABSTRACT

A self-tuning impedance-matching microelectromechanical (MEMS) circuit, methods for making and using the same, and circuits including the same are disclosed. The MEMS circuit includes a tunable reactance element connected to a first mechanical spring, a separate tunable or fixed reactance element, and an AC signal source configured to provide an AC signal to the tunable reactance element(s). The reactance elements comprise a capacitor and an inductor. The AC signal source creates an electromagnetically energy favorable state for the tunable reactance element(s) at resonance with the AC signal. The method of making generally includes forming a first MEMS structure and a second mechanical or MEMS structure in/on a mechanical layer above an insulating substrate, and coating the first and second structures with a conductor to form a first tunable reactance element and a second tunable or fixed reactance element, as in the MEMS circuit.

20 Claims, 25 Drawing Sheets

(51) Int. Cl.
　　　*H01L 23/64*　　(2006.01)
　　　*H01L 49/02*　　(2006.01)

(56) References Cited

U.S. PATENT DOCUMENTS

| | | | |
|---|---|---|---|
| 6,356,149 B1 | 3/2002 | Stengel et al. |
| 6,480,110 B2 | 11/2002 | Lee et al. |
| 6,573,822 B2 | 6/2003 | Ma |
| 6,815,739 B2 | 11/2004 | Huff et al. |
| 6,842,101 B2 | 1/2005 | Maguire et al. |
| 6,856,499 B2 | 2/2005 | Stokes |
| 7,148,783 B2 | 12/2006 | Parsche et al. |
| 7,202,768 B1 | 4/2007 | Harvey et al. |
| 7,274,278 B2 | 9/2007 | Weller et al. |
| 7,319,580 B2 | 1/2008 | Chou |
| 7,332,980 B2 | 2/2008 | Zhu et al. |
| 7,446,628 B2 | 11/2008 | Morris, III |
| 7,586,387 B2 | 9/2009 | Van Delden |
| 7,671,693 B2 | 3/2010 | Brobston et al. |
| 7,710,232 B1 | 5/2010 | Stalford et al. |
| 7,741,936 B1 | 6/2010 | Weller et al. |
| 7,831,210 B1 | 11/2010 | Freeman et al. |
| 7,847,669 B2 | 12/2010 | Ayazi et al. |
| 7,907,033 B2 | 3/2011 | Morris, III et al. |
| 7,982,291 B2 | 7/2011 | Kuisma |
| 8,026,773 B2 | 9/2011 | Zhu et al. |
| 8,039,922 B2 | 10/2011 | Ni |
| 8,124,435 B2 | 2/2012 | Kuisma |
| 8,131,232 B2 | 3/2012 | Muhammad |
| 8,450,816 B2 | 5/2013 | Kuisma |
| 8,503,157 B2 | 8/2013 | Ikehashi |
| 8,723,368 B2 | 5/2014 | Choudhary et al. |
| 8,742,859 B2 | 6/2014 | Jin et al. |
| 8,963,674 B2 | 2/2015 | Lee et al. |
| 9,124,236 B2 | 9/2015 | Liang et al. |
| 9,270,249 B2 | 2/2016 | Yen et al. |
| 9,583,250 B2 | 2/2017 | Meyer et al. |
| 9,628,135 B1 | 4/2017 | Broyde et al. |
| 2006/0226501 A1 | 10/2006 | Chou |
| 2007/0296548 A1 | 12/2007 | Hall et al. |
| 2010/0038753 A1 | 2/2010 | Ni |
| 2011/0063773 A1 | 3/2011 | Ikehashi |
| 2012/0119312 A1 | 5/2012 | Kuisma |
| 2015/0119052 A1 | 4/2015 | Caimi et al. |
| 2016/0156218 A1 | 6/2016 | Osada |

OTHER PUBLICATIONS

Jaber Merrikhi Ahangarkolaei and Mir Majid Teymoori; "The Design of a New Linear MEMS Variable Inductor"; 6 pgs.; International Journal of Innovative Research in Electrical, Electronics, Instrumentation and Control Engineering; Dec. 2013; vol. 1 Issue 9.

Chang-Hoon Han et al.; "Parallel-Plate MEMS Variable Capacitor with Superior Linearity and Large Tuning Ratio Using a Levering Structure"; 10 pgs.; Journal of Microelectromechanial Systems; Dec. 2011; vol. 20 No. 6.

Mir Majid Teymoori et al.; "MEMS Tunable Inductors: A Survey"; pp. 1868-1878; Australian Journal of Basic and Applied Sciences; 2011.

R. R. Mansour et al.; "Actuators for RF Mems Devices"; 5 pgs.; IFAC Mechatronic Systems, Sydney, Australia; 2004.

Gabriel M. Rebeiz; "RF MEMS, Theory, Design, and Technology"; pp. 346-347; Wiley-Interscience; 2003.

Hiongrui Jiang et al.; "A Universal MEMS Fabrication Process for High-Performance On-Chip RF Passive Components and Circuits"; 5 pgs.; Solid-State Sensor and Actuator Workshop; Hilton Head Island, South Carolina; Jun. 4-8, 2000.

Carol Livermore; "Design and Fabrication of Microelectromechanical Devices"; 50 pgs.; Massachusetts Institute of Technology; Spring, 2007.

International Search Report and Written Opinion dated Dec. 21, 2017; PCT International Application No. PCT/US2017/049615; 10 pgs; International Searching Authority/United States, Commissioner for Patents, Alexandria, Virginia.

A. Cammarano et al. "Tuning a Resonant Energy Flarvestor Using a Generalized Electrical Load"; Smart Materials and Structures; vol. 19; Issue 5; Dated May 2010; pp. 2-4 and 6.

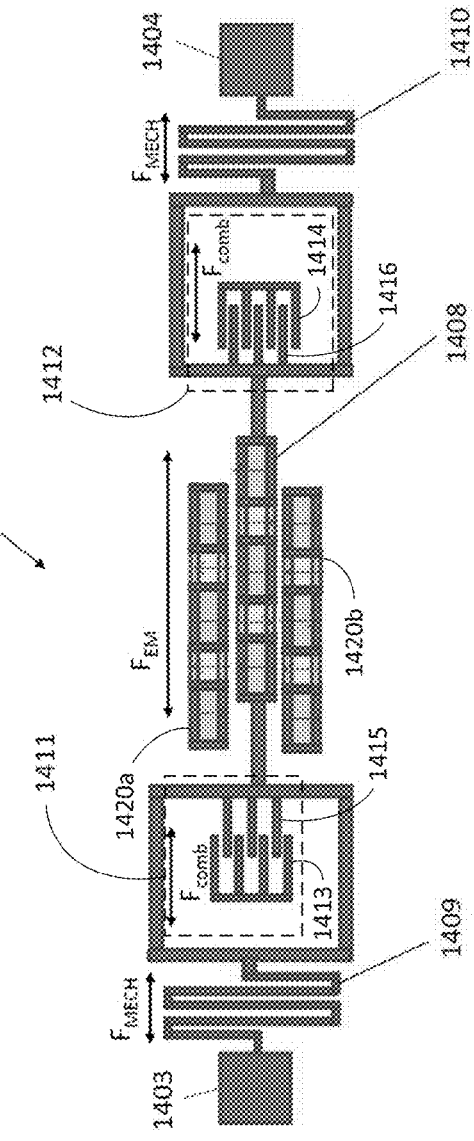
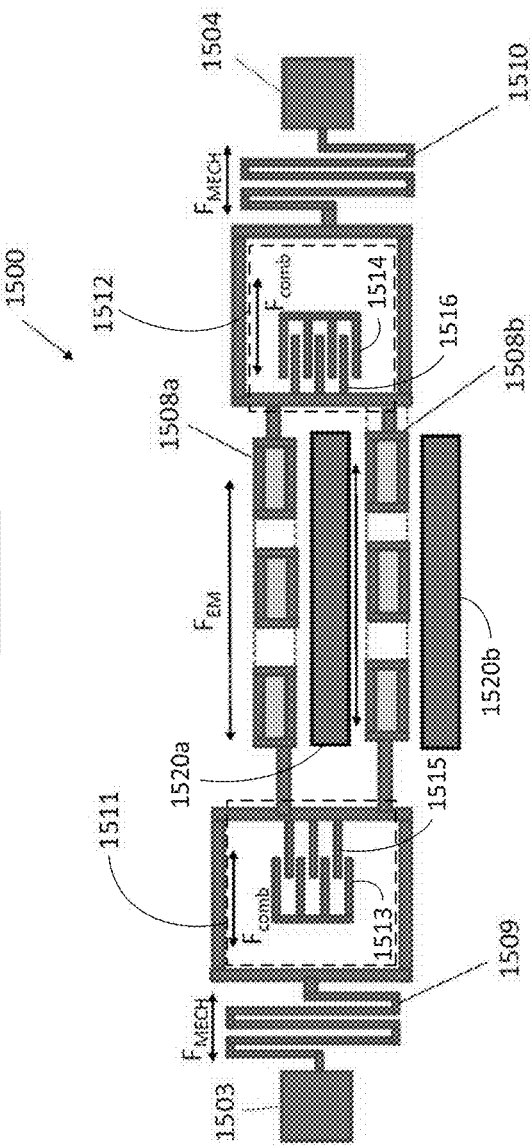

US 10,491,159 B2

SELF-TUNING MICROELECTROMECHANICAL IMPEDANCE MATCHING CIRCUITS AND METHODS OF FABRICATION

CROSS REFERENCE TO RELATED APPLICATION(S)

This application claims the benefit of U.S. Provisional Patent Application No. 62/384,657, filed on Sep. 7, 2016, incorporated herein by reference as if fully set forth herein.

FIELD OF THE INVENTION

Self-tuning microelectromechanical impedance matching circuits are disclosed. The microelectromechanical circuit has at least one electromagnetically tunable reactance device connected to a first mechanical spring. In a preferred embodiment, the self-tuning microelectromechanical circuit has at least one electromagnetically tunable capacitor element connected to a first mechanical spring and at least one electromagnetically tunable inductor element connected to a second mechanical spring in which the tunable inductor element and tunable capacitor element are connected electrically. The self-tuning microelectromechanical impedance matching circuit has an unloaded self-resonant frequency $\omega\_UL = 1/SQRT(L\_o * C\_o)$ where $L\_o$ is the equilibrium unloaded circuit inductance and $C\_o$ is the equilibrium unloaded circuit capacitance. When an AC electrical signal is applied to the self-tuning microelectromechanical circuit, electromagnetic forces are created in the tunable capacitor and tunable inductor elements, which move the elements and increase or decrease the inductance and capacitance of the self-tuning circuit and change the resonant frequency $\omega = 1/SQRT(L * C)$ until resonance is achieved or other physical limits are reached. The circuit will self-tune toward resonance with sufficient electromagnetic forces if the resonant frequency is within a range of values that can be obtained by the self-tuning capacitive and inductive elements. Various methods of providing variable capacitance and inductance for self-tuning microelectromechanical circuits and methods of circuit fabrication are described.

BACKGROUND OF THE INVENTION

Radio frequency communications such as cellular, WiFi, Bluetooth, Zigbee, etc. require a range of different frequencies and circuit filtering techniques to facilitate clear communication. RF antennas are increasingly required to operate over wider ranges of frequencies, resulting in performance degradation across frequencies. Current techniques to tune antennas involve switching banks of discrete capacitors that involve feedback and complex algorithms. Lumped matching networks provide discrete frequency filtering but suffer from significant insertion loss and are difficult to tune in real time. Current techniques also consume significant power and do not provide fine tuning to achieve high Q. It would be extremely beneficial to provide passively self-tuning impedance matching circuits to improve power and signal transfer, reduce wasted power consumption and signal reflection, and reduce algorithm complexity needed to tune discrete networks. In addition, energy harvesting and inductively coupled power transfer circuits are sensitive to impedance matching but do not employ economically viable methods to self-tune impedance to maximize power transfer.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY OF THE INVENTION

Embodiments of the present invention relate to a self-tuning impedance-matching microelectromechanical (MEMS) circuit, methods of making and using the same, and circuits comprising the same. The self-tuning impedance-matching MEMS circuit generally comprises a first tunable reactance element connected (directly or indirectly) to a first mechanical spring and having a tunable reactance, a second tunable or fixed reactance element, one or more electrical connections between the first reactance element and the second reactance elements, and an AC signal source configured to (i) provide an AC signal to the first and second reactance elements and (ii) create an electromagnetic force on the first reactance element that moves the first reactance element and tunes the self-tuning impedance-matching circuit toward resonance with the AC signal. The AC signal has a frequency. One of the first and second reactance elements comprises a capacitor, and the other of the first and second reactance elements comprises an inductor.

In various embodiments of the self-tuning impedance-matching circuit, the first reactance element comprises a self-tuning capacitor element or a self-tuning inductor element. In further embodiments of the self-tuning impedance-matching circuit, the first reactance comprises a self-tuning inductor, the second reactance element comprises a self-tuning capacitor, and the self-tuning impedance-matching circuit further comprises an electrical connection between the self-tuning inductor and the self-tuning capacitor. All or part of the electrical connection may comprise a superconducting material.

In other or further embodiments of the self-tuning impedance-matching circuit, the first reactance element may be connected in series or in parallel with the second reactance element, and/or the self-tuning impedance-matching circuit may further comprise a plurality of actuator electrodes electrically coupled to the first reactance element. The actuator electrodes may be configured to fine tune or de-tune a resonance of the self-tuning impedance-matching circuit.

Another aspect of the present invention relates to a method of fabricating a self-tuning microelectromechanical circuit, comprising forming a first microelectromechanical (MEM) structure and a second mechanical or MEM structure in or on a mechanical layer above an insulating substrate, and coating the first MEM structure and the second mechanical or MEM structure with a conductor to form a first tunable reactance element and a second tunable or fixed reactance element. As for the self-tuning impedance-matching MEMS circuit, one of the first and second reactance elements comprises a capacitor, and the other of the first and second reactance elements comprises an inductor.

In various embodiments, the insulating substrate comprises a silicon, silicon dioxide, glass, epoxy, ceramic, sapphire, or silicon on insulator (SOI) wafer, and the conductor comprises copper, aluminum, silicon, tungsten, titanium, tantalum, tin, nickel, gold, graphene, platinum, silver or a superconducting material comprising niobium-titanium, niobium-tin, YBaCuO, BiCaSrCuO, TlBaCuO, TlCa-BaCuO, or HgCaBaCuO. In some embodiments, the mechanical layer comprises a mechanical substrate. The mechanical substrate may comprise a silicon, gallium arsenide, silicon on sapphire, silicon on insulator, silicon carbide or silicon germanium wafer, and the method may further comprise bonding the mechanical substrate to the insulating substrate prior to forming the first and second structures.

In other or further embodiments, the method may further comprise forming one or more drivers in the mechanical layer, attaching a protective cover over the first reactance device, forming a plurality of conducting buses (e.g., external to the protective cover), and/or forming one or more fixed capacitors and/or inductors and/or one or more additional tunable capacitors and/or inductors. The driver(s) may be configured to move the first MEM structure with respect to the insulating substrate upon application of an electrostatic force to at least one of the drivers. When the method comprises attaching the protective cover over the first reactance device and forming the conducting buses, the conducting buses may be electrically connected to the first MEM structure and/or circuitry configured to control movement of the first MEM structure. When the method comprises forming one or more fixed capacitors and/or inductors, the fixed capacitors and/or inductors may be formed in the mechanical layer and/or may be electrically coupled to the first MEM structure. In some cases, the fixed capacitors and/or inductors comprise at least one high Q factor inductor.

In some embodiments, the second structure is a second MEM structure, and the method comprises forming a plurality of MEM structures including the first and second MEM structures in the mechanical layer, and coating the plurality of MEM structures with the conductor. In various examples, forming the plurality of MEM structures comprises patterning and etching the mechanical layer, and coating the plurality of MEM structures comprises depositing the conductor by sputtering, electroplating or electroless plating, chemical vapor deposition or atomic layer deposition.

Yet another aspect of the present invention relates to a circuit, comprising at least one device and at least one of the present self-tuning circuits, directly or indirectly electromagnetically coupled to the device(s). The device(s) may be selected from an antenna, an energy storage device, a piezoelectric energy harvester, a piezoelectric resonator, a MEMS resonator, and an inductively coupled circuit.

In some embodiments, the device(s) comprise the antenna, the circuit further comprises a plurality of channels, and the self-tuning circuit comprises first and second self-tuning circuits. Each channel has a different frequency. The first self-tuning circuit is connected in series with at least one of the channels, and the second self-tuning circuit is connected in parallel between adjacent channels.

In other embodiments, the device(s) comprise the antenna and the energy storage device, and the self-tuning circuit comprises at least one self-tuning microelectromechanical impedance-matching circuit. The energy storage device may comprise a battery or a capacitor configured to store electromagnetic energy from the antenna and/or the self-tuning microelectromechanical (MEMS) impedance-matching circuit. Alternatively, the device(s) may comprise the piezoelectric energy harvester and the energy storage device, and the energy storage device may be configured to store electromagnetic energy from the piezoelectric energy harvester and/or the self-tuning MEMS impedance-matching circuit.

In further embodiments, the device comprises the inductively coupled circuit (e.g., an inductive power transformer or other inductively charged device), the self-tuning circuit comprises at least one self-tuning MEMS impedance-matching circuit, and the circuit further comprises an electrical load receiving inductive power from the inductively coupled circuit and/or the at least one self-tuning microelectromechanical impedance-matching circuit.

These and other aspects of the present invention will become readily apparent from the detailed description of various embodiments below.

BRIEF DESCRIPTION OF THE DRAWINGS

FIGS. 14A-B and 15A-B show configurations of tunable inductor and capacitor elements, which may also include comb actuators to provide for active, independent tuning of each tunable element, or lumped circuit elements and/or externally tunable capacitive and/or inductive elements, in accordance with embodiments of the present invention.

DETAILED DESCRIPTION

Reference will now be made in detail to various embodiments of the invention, examples of which are illustrated in the accompanying drawings. While the invention will be described in conjunction with the following embodiments, it will be understood that the descriptions are not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

The technical proposal(s) of embodiments of the present invention will be fully and clearly described in conjunction with the drawings in the following embodiments. It will be understood that the descriptions are not intended to limit the invention to these embodiments. Based on the described embodiments of the present invention, other embodiments can be obtained by one skilled in the art without creative contribution and are in the scope of legal protection given to the present invention.

Furthermore, all characteristics, measures or processes disclosed in this document, except characteristics and/or processes that are mutually exclusive, can be combined in any manner and in any combination possible. Any characteristic disclosed in the present specification, claims, Abstract and Figures can be replaced by other equivalent characteristics or characteristics with similar objectives, purposes and/or functions, unless specified otherwise.

The present invention concerns low power self-tuning microelectromechanical circuits that passively tune toward a resonant frequency. The present self-tuning microelectromechanical circuits may improve power and signal transfer by using energy stored within the same circuit. The invention also provides for active tuning or de-tuning of the self-tuning circuits by an actuator as desired.

Figure 22A:
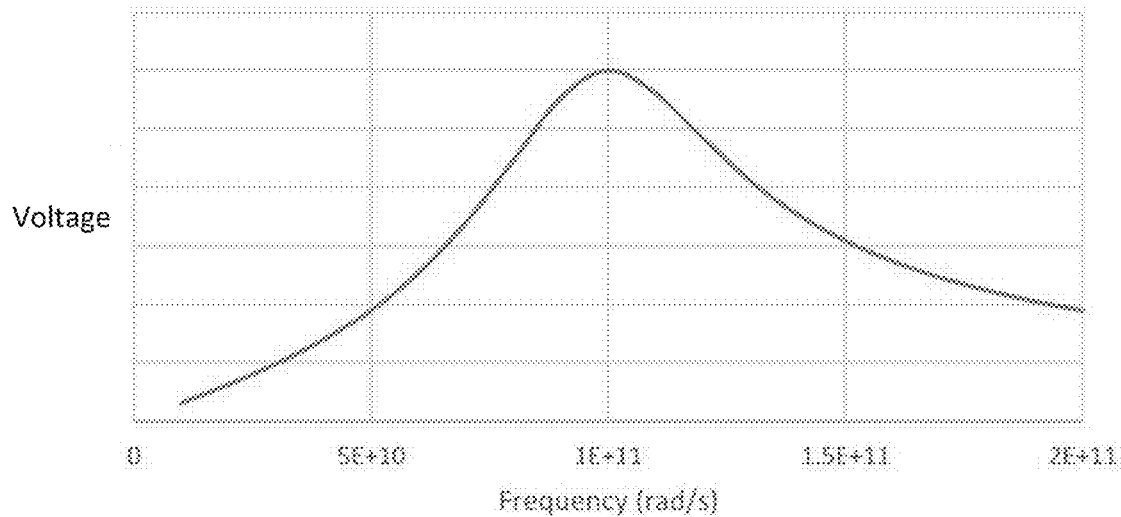
FIGS. 22A-B respectively show a typical signal resonance curve for an LC oscillator circuit and a typical plot of the electromagnetic energy stored in an LC oscillator.
Figure 22B:
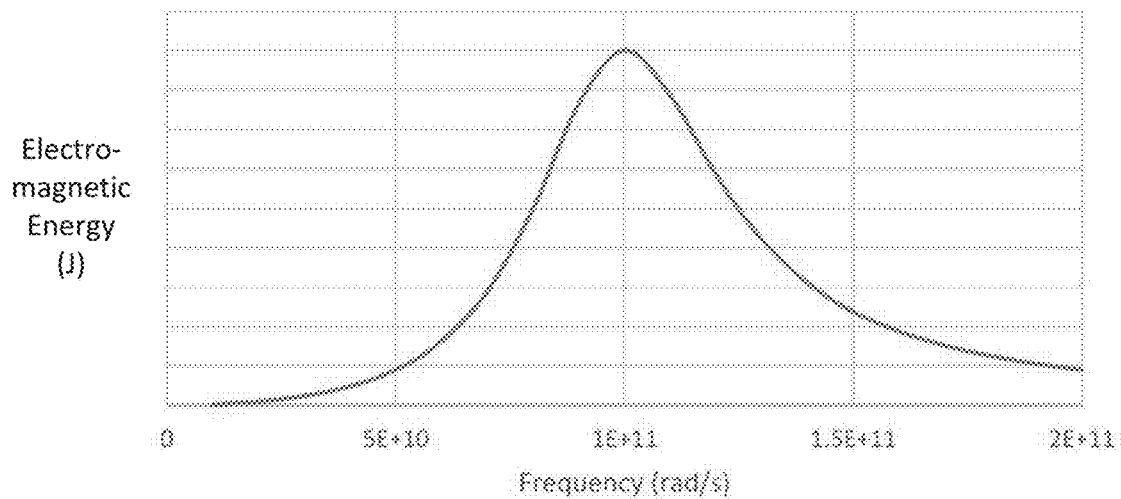

The present self-tuning circuit comprises at least one capacitor and at least one inductor, with at least one of the elements (the capacitor, the inductor or both) having a self-tuning capability. The inductor and capacitor, connected either in series or in parallel, have an unloaded resonance frequency given as $w\_o = 1/SQRT(L\_o*C\_o)$, where $L\_o$ and $C\_o$ are respective values of inductance and capacitance for elements in an electrically unloaded, mechanical equilibrium state. FIG. 22a shows a typical signal resonance curve for an LC oscillator circuit, with voltage signal amplitude on the y axis and angular frequency w on the x axis. The maximum signal amplitude occurs at the resonant frequency, $w\_o$. FIG. 22b shows a typical plot of the electromagnetic energy stored in an LC oscillator, $U\_EM = 0.5*L*I^2 + 0.5*C*V^2$ where L is the inductance, C is the capacitance, I is the current in the inductor and V is the voltage across the capacitor. The electromagnetic energy stored in the LC oscillator is proportional to the square of signal amplitude and also reaches a peak at the resonant frequency. The LC oscillator circuit elements experience electromagnetic forces determined by the derivative of the electromagnetic energy with respect to displacement. The self-tuning reactive elements described in this disclosure are designed to move in response to electromagnetic forces, change their reactance values upon movement and tune the circuit toward resonance based on the applied signal frequency.

The invention, in its various aspects, will be explained in greater detail below with regard to exemplary embodiments.

Figure 1A:
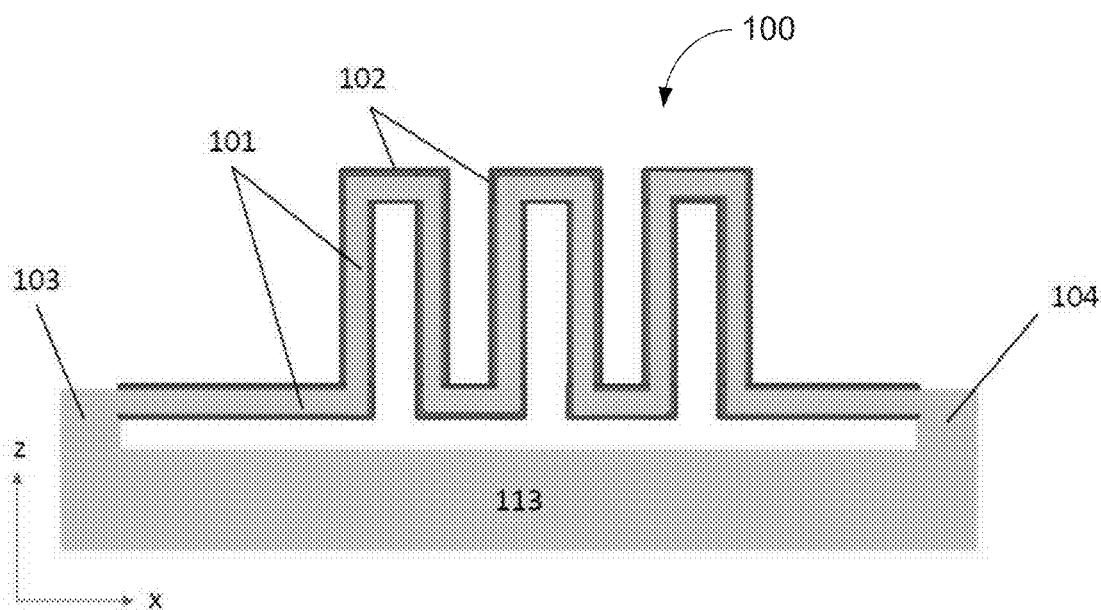
FIGS. 1A-D are diagrams showing one or more embodiments of a tunable inductor element in accordance with the present invention.
Figure 1B:
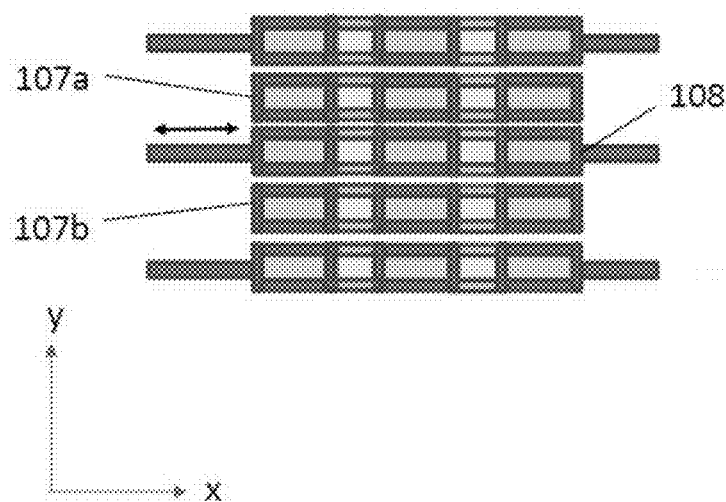
Figure 1C:
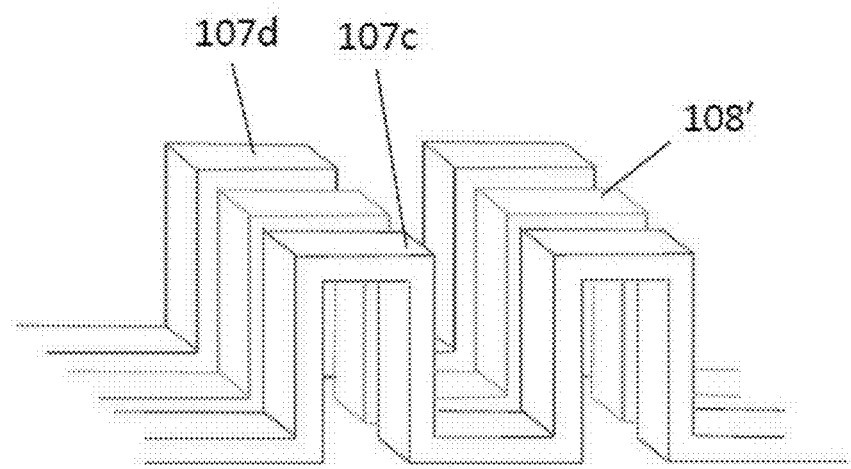

FIGS. 1a-d show a preferred embodiment of a tunable inductor element as previously described in U.S. patent application Ser. No. 15/204,247. FIG. 1A is a side view, FIG. 1B is a top view of a structure including additional vertical serpentine structures (e.g., 107a-b) adjacent to the movable vertical serpentine 108, and FIG. 1C is a perspective view of a structure including additional vertical serpentine structures (e.g., 107c-d) adjacent to a movable vertical serpentine 108'. The tunable inductor element consists of a mechanical structure (vertical serpentine 100) formed from etched silicon 101 and coated with electroplated or electroless copper 102 or other high conductivity material. The tunable inductor element is supported by flexible mechanical springs and/or by posts (not shown) anchored at opposite sides 103 and 104 of the tunable inductor element to a substrate 113. The element 108 tunes inductance by changing the amount of magnetic flux which couples between it and adjacent vertical serpentine elements 107 that are part of the same current path connected in series. The tunable inductor element 108 may alternately tune inductance by changing the amount of magnetic flux which couples between it and adjacent serpentine elements 107 that contain parallel currents connected in parallel.

Figure 1D:
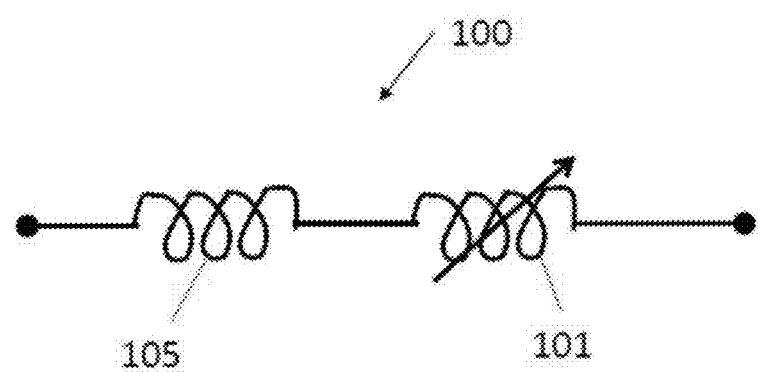

With a constant magnitude voltage source applied, tunable inductor elements in series experience electromagnetic forces that pull the elements together, increasing the magnetic energy stored as current-induced magnetic fields align with each other. Although the electromagnetic forces tend to pull the elements together to close the gap between elements, due to symmetry and mechanical stiffness of the element, the net electromagnetic force is in the x direction, perpendicular to the current-induced magnetic fields and the gaps between elements. The tunable inductor element may also include multiple vertical serpentine arms 107 connected to springs which move toward or away from each other in the x direction due to electromagnetic forces, thereby displacing the arms 107 and 108 and reducing the total displacement required to achieve resonance. FIG. 1D shows a circuit schematic of a tunable inductor element 100 including tunable inductor 101 and mechanical spring 105.

Figure 2C:
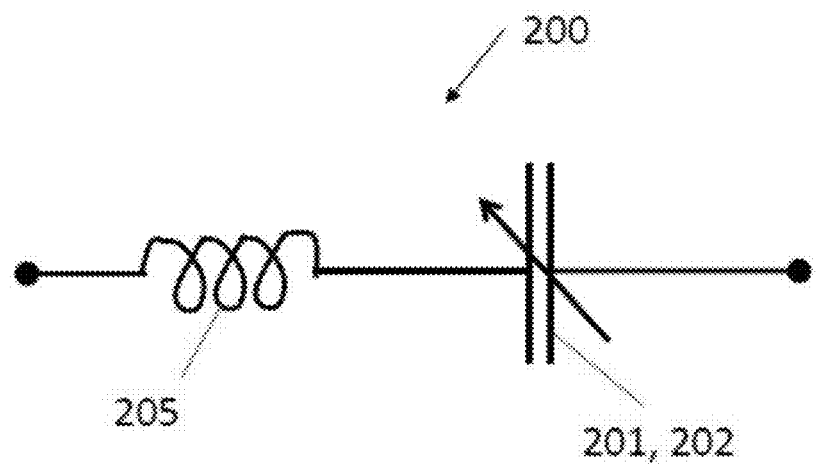
FIGS. 2A-C show one or more embodiments of a tunable capacitor element in accordance with the present invention.
Figure 2A:
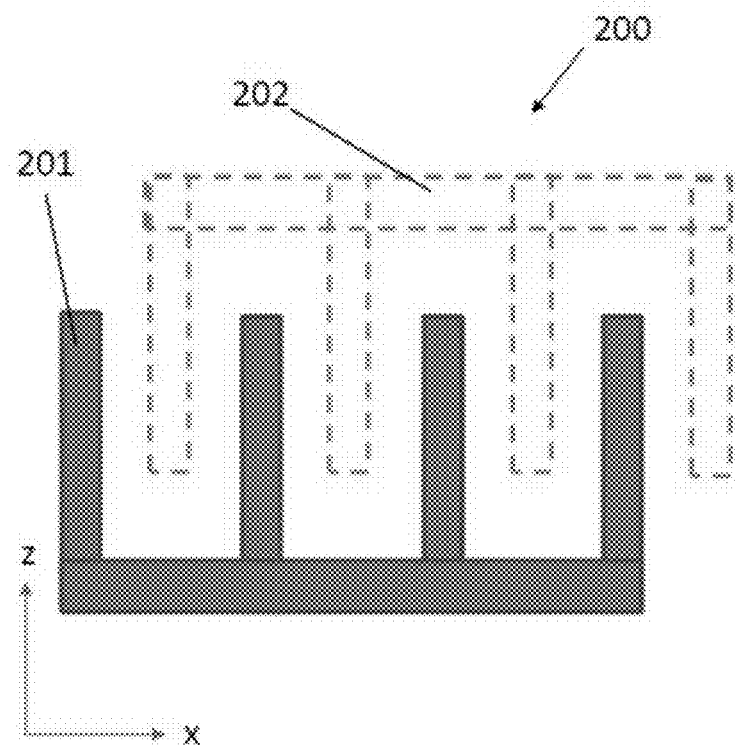
Figure 2B:
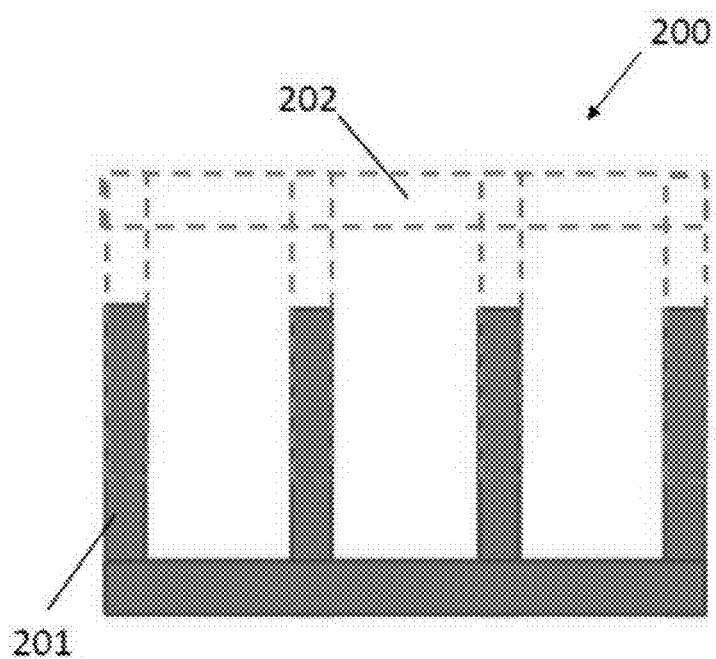

FIGS. 2A-C show a preferred embodiment of a tunable capacitor element as previously described in U.S. patent application Ser. No. 15/204,247. FIG. 2A is a side view of the tunable capacitor in a lower capacitance state, and FIG. 2B is a side view of the tunable capacitor in a higher capacitance state. The tunable capacitor element 200 consists of a vertical comb structure 201 formed from etched silicon and coated with electroplated or electroless copper or other high conductivity material. The tunable capacitor element 200 is supported by flexible mechanical springs (not shown) anchored at opposite ends of the tunable capacitor element. The element 201 tunes capacitance by changing the amount of electric field flux which couples between it and adjacent vertical capacitor elements 202 that are part of the same current path. FIG. 2C shows a circuit schematic of a tunable capacitor 200 including tunable capacitor elements 201 and 202 and mechanical spring 205. With a constant magnitude voltage source applied the tunable capacitor element experiences electromagnetic forces that pull the elements together, increasing the electric energy stored as charge-induced electric fields align with each other. Although the electromagnetic forces tend to pull the elements together to close the gap between elements, due to symmetry and mechanical stiffness of the element the net electromagnetic force is in the X direction, perpendicular to the charge-induced electric fields and the gaps between elements. The tunable capacitor element 200 may include multiple capacitor arms connected by springs which move toward or away from each other in the x direction due to electromagnetic forces, thereby reducing the total displacement required to achieve resonance.

Figure 3:
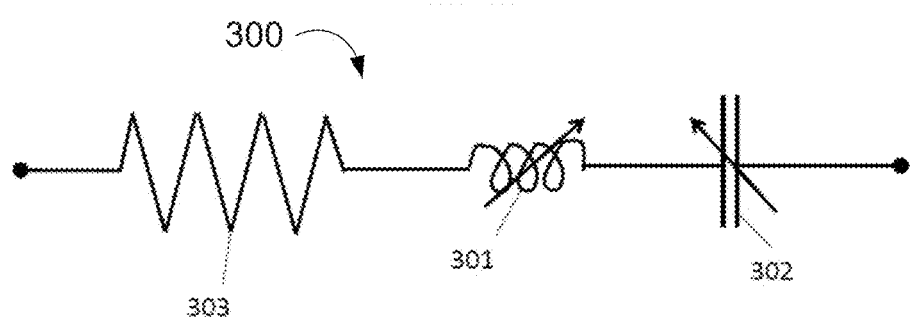
FIG. 3 is a schematic diagram of a series RLC circuit, including tunable inductive and capacitive elements in accordance with embodiments of the present invention.

FIG. 3 shows a schematic diagram of a series RLC circuit 300, in which the inductance L 301 and capacitance C 302 include tunable inductive and capacitive elements, respectively. Without an applied load, the series RLC self-tuning circuit has an unloaded self-resonant frequency given by w_o=1/SQRT(L_o*C_o) where L_o and C_o are respective values of inductance and capacitance for elements in an electrically unloaded, mechanical equilibrium state. In a preferred embodiment, the resistance R 301 is made as low as possible while the inductance L_o is preferably large relative to the capacitance C_o in order to provide a high Q factor, which is a measure of the stored electromagnetic energy to the energy dissipated per cycle. The Q factor for an RLC series circuit is given by Q=SQRT(L/C)/R. In order to increase the Q factor, the inductance can be increased by adding a high Q fixed inductance L_F in series with a high Q tunable inductor element L_tun. For example, a high Q fixed vertical spiral inductor element 400 such as that shown in FIG. 4 may be added in series with a tunable inductor L_tun. The structure shown in FIG. 4 can also be used in a self-tuning MEMS circuit as both a mechanical spring and tunable inductor simultaneously. The Q factor of the structure 400 shown in FIG. 4 can be increased by electromagnetically coupling multiple self-tuning resonator circuits. The Q factor for the series RLC circuit can also be increased by using high conductivity materials such as copper or graphene or ideally by using cooled superconducting materials for electrical connections between components.

High Q circuits are advantageous since there is more energy stored in the tunable capacitor and inductor elements respectively than in lower Q circuits, and this energy in turn is used to self-tune the circuits toward resonance.

Figure 5A:
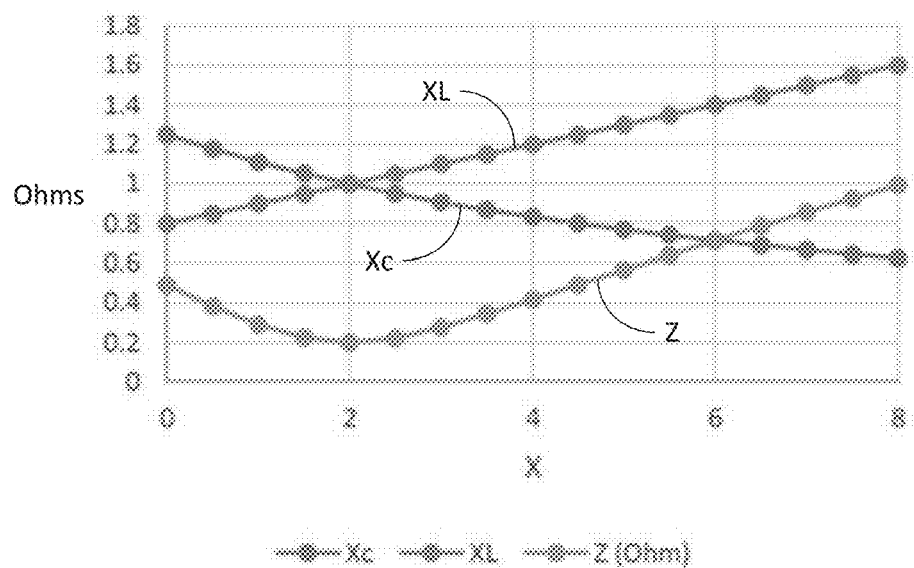
FIGS. 5A-D are graphs showing the reactance and impedance as a function of the displacement of the tunable inductor and capacitor elements from their equilibrium position, the voltage across the capacitor and the magnitude of the current in the inductor, the energy stored in the capacitor and inductor, and the resulting electromagnetic and mechanical restoring forces as a function of the displacement of the tunable inductor and capacitor elements from their equilibrium position, all in accordance with embodiments of the present invention.
Figure 5B:
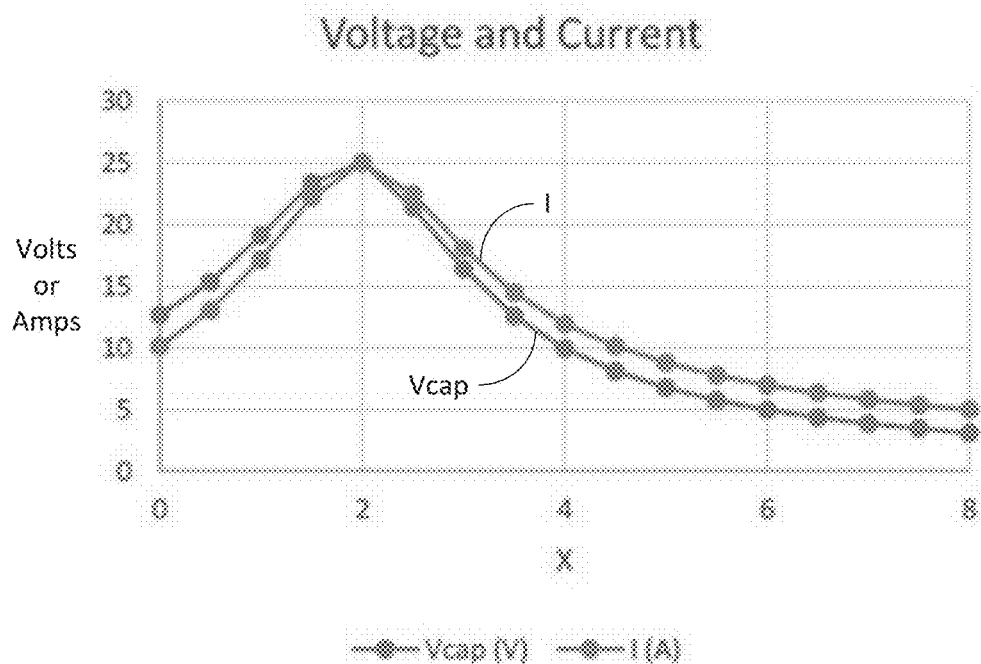
Figure 5C:
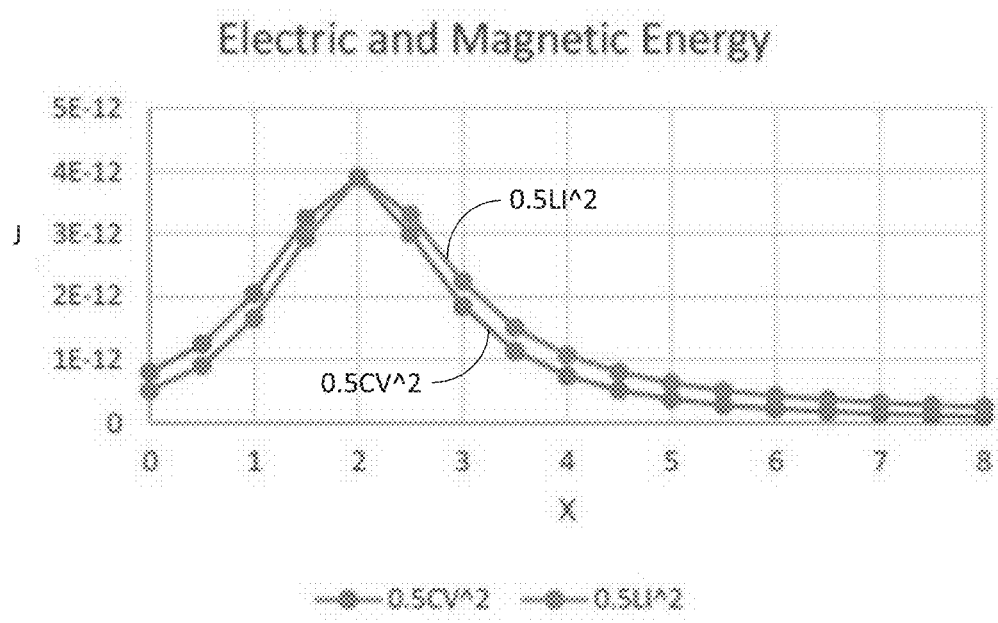
Figure 5D:
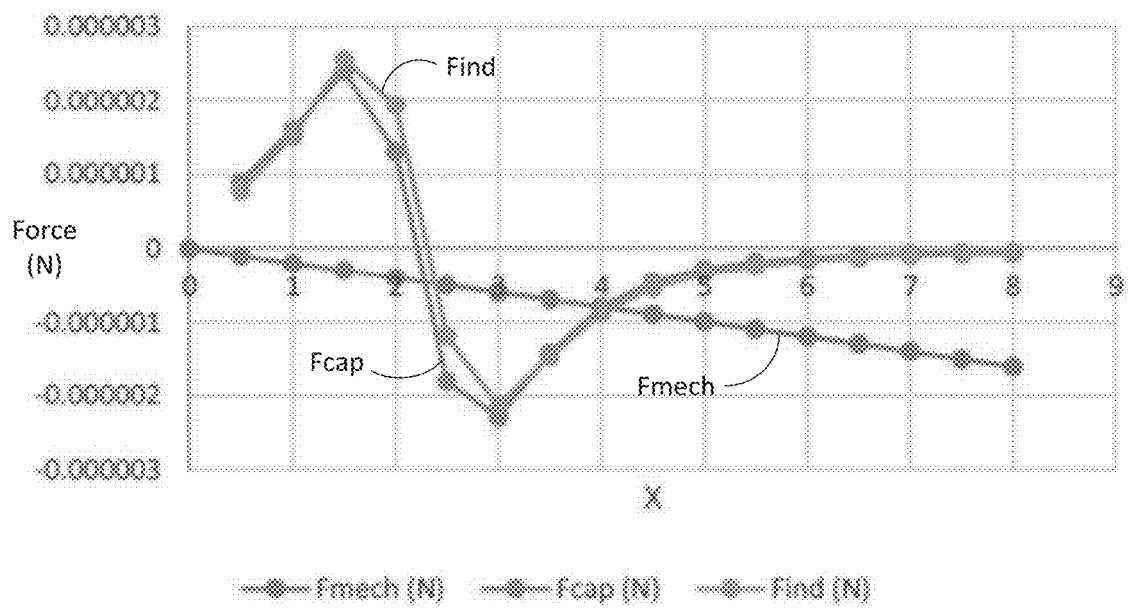

When a constant magnitude AC voltage is applied across the self-tuning series RLC circuit of FIG. 3, energy is alternately stored in the capacitor and inductor with oscillations at the applied frequency w_app. The energy in the capacitor and inductor MEMS elements leads to electromagnetic forces given by F_EM=dU_EM/dx, where U_EM is the electromagnetic energy in a given element, and dU_EM/dx is the derivative of electromagnetic energy with respect to X, the direction of allowed motion of the tunable elements. FIGS. 5A-D show the reactances and impedances (FIG. 5A), voltage across the capacitor and current magnitude in the inductor (FIG. 5B), energy stored in the capacitor and inductor (FIG. 5C), and resulting electromagnetic and mechanical restoring forces as a function of x, the displacement of each tunable inductor and capacitor element from its equilibrium position (FIG. 5D). In the example of FIGS. 5A-D, the applied frequency w_app is lower than the self-resonant frequency w_o=1/SQRT(L_o*C_o). FIG. 5C indicates that the electric and magnetic energy reaches a peak at the point x=2, corresponding to a displacement of both the tunable inductor element and tunable capacitor element of 2 um away from its respective unloaded equilibrium position. FIG. 5D shows the forces on each of the tunable reactance elements, with the mechanical restoring force increasing linearly in magnitude with displacement x but in a negative direction, opposing motion in the +x direction. FIG. 5D also shows the electromagnetic forces on the tunable inductor and capacitor elements, respectively, indicating large positive forces in the +x direction up to x=2 um, and large negative forces beyond the point x=2 um. The net force on each self-tuning element is zero and reaches a new equilibrium at or near x=2 um. The equilibrium is stable since displacements <2 um lead to forces in the +x direction, while displacements >2 um lead to forces in the −x direction, bringing each element back to equilibrium. FIG. 5B shows the current in the inductor and voltage across the capacitor peak at the point x=2 um, and FIG. 5A shows that x=2 um is indeed a resonance point since at this value the inductive reactance X_L is equal to the capacitive reactance X_C and the total impedance of the series RLC circuit is at a minimum. In a preferred embodiment, the mechanical relaxation time is large in comparison to the period of AC oscillations (e.g., by 2×, 5×, 10×, 100× or more), such that the mechanical system is significantly overdamped, and the tunable reactance elements do not undergo significant oscillations.

Figure 6A:
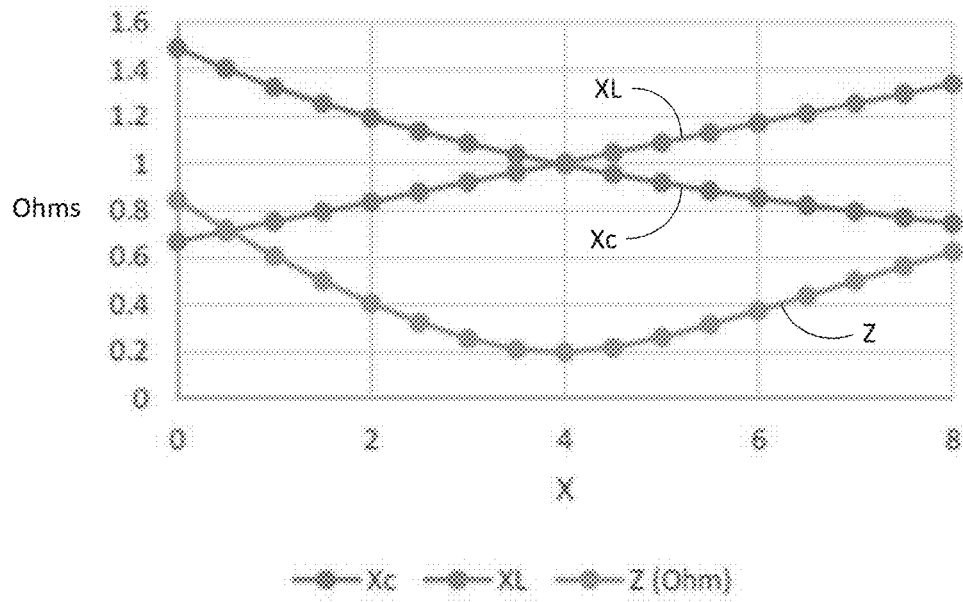
FIGS. 6A-D are graphs showing the same parameters as FIGS. 5A-D for a different example circuit.
Figure 6B:
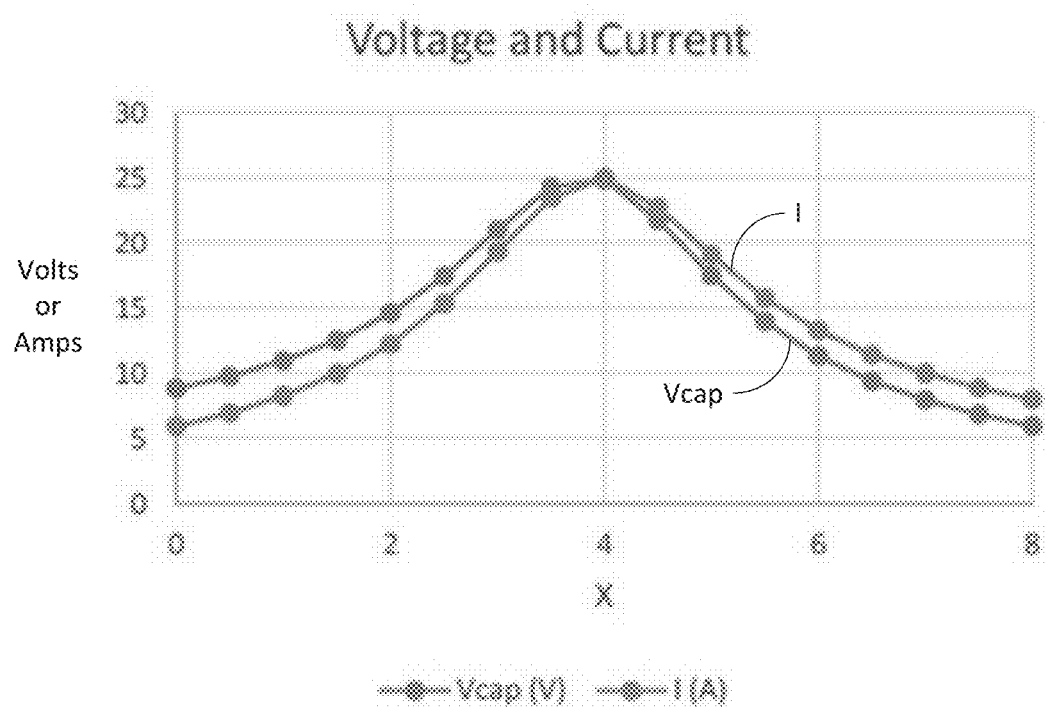
Figure 6C:
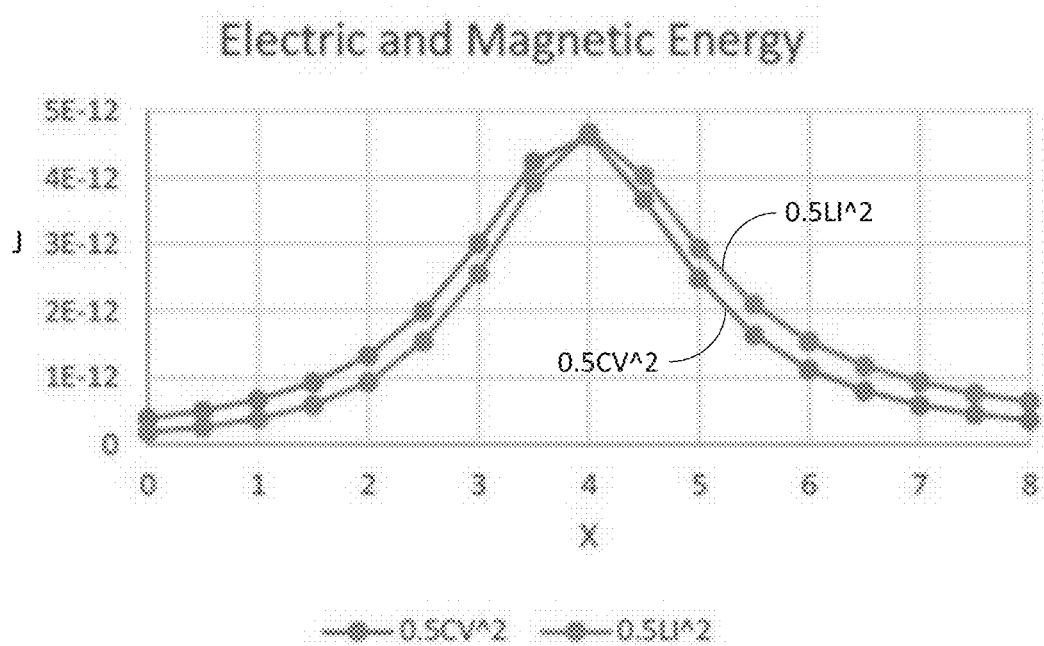
Figure 6D:
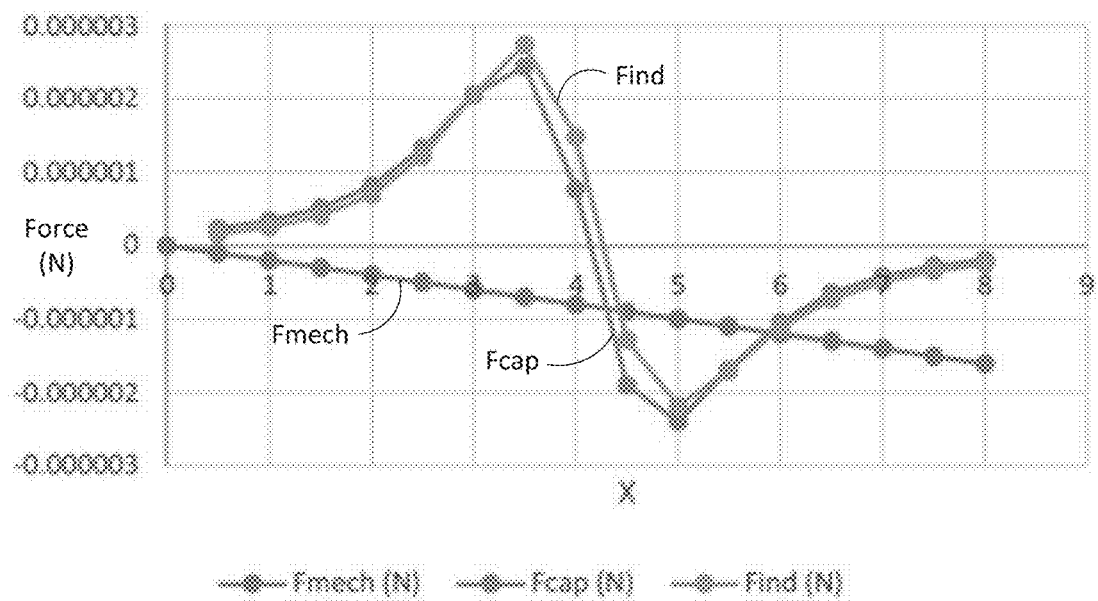

In the example of FIGS. 6A-D, the applied frequency w_app is lower than the self-resonant frequency w_o=1/SQRT(L_o*C_o) and also lower than the applied frequency in FIGS. 5A-D. FIG. 6C indicates that the electric and magnetic energy reaches a peak at the point x=4, corresponding to a displacement of both the tunable inductor element and tunable capacitor element of 4 um away from its unloaded equilibrium position. FIG. 6D shows the forces on each of the tunable inductor elements, with the mechanical restoring force increasing linearly in magnitude with displacement x but in a negative direction, opposing motion in the +x direction. FIG. 6d also shows the electromagnetic forces on the tunable inductor and capacitor elements, respectively, indicating large positive forces in the +x direction up to x=4 um, and large negative forces beyond the point x=4 um. The net force on each self-tuning element is zero and reaches a new equilibrium at or near x=4 um. The equilibrium is stable since displacements <4 um lead to forces in the +x direction, while displacements >4 um lead to forces in the −x direction, bringing each element back to equilibrium. FIG. 6B shows the current in the inductor and voltage across the capacitor peak at the point x=4 um, and FIG. 6A shows that x=4 um is indeed a resonance point since at this value the inductive reactance X_L is equal to the capacitive reactance X_C and the total impedance of the series RLC circuit is at a minimum.

Figure 7A:
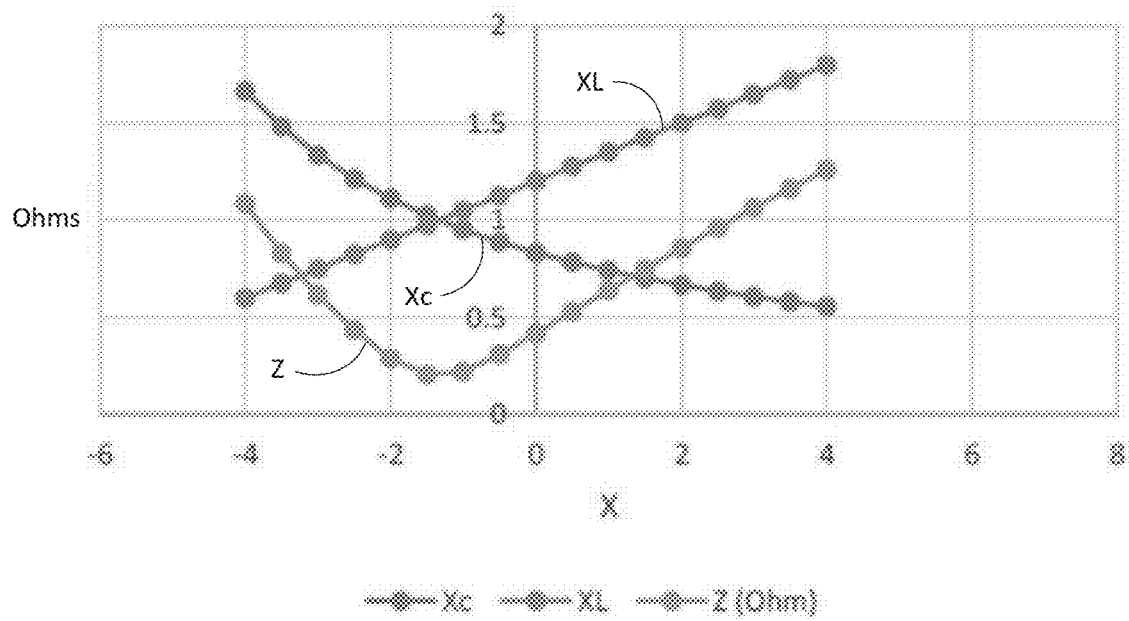
FIGS. 7A-D are graphs showing the same parameters as FIGS. 6A-D for a circuit configuration according to the present invention where the applied frequency is larger than the self-resonant frequency.
Figure 7B:
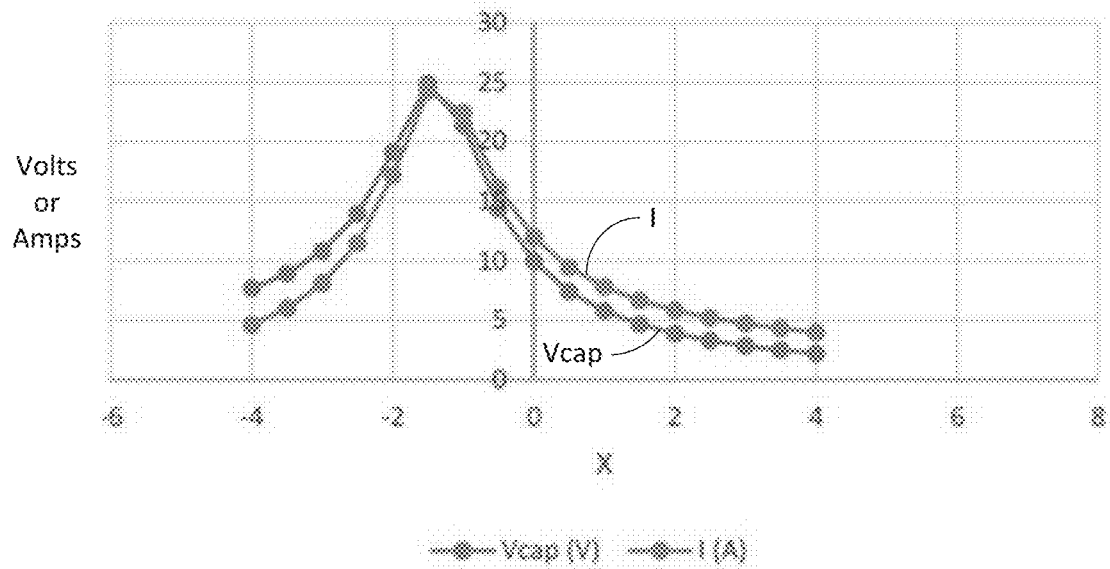
Figure 7C:
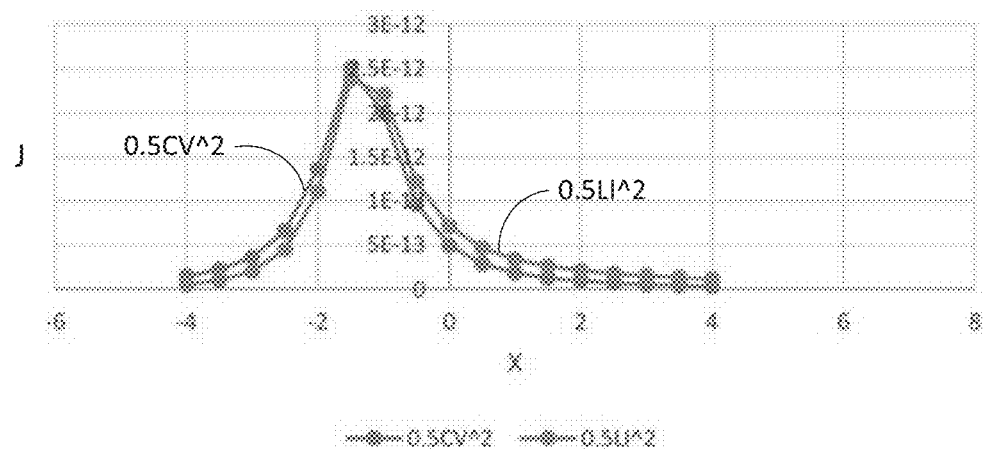
Figure 7D:
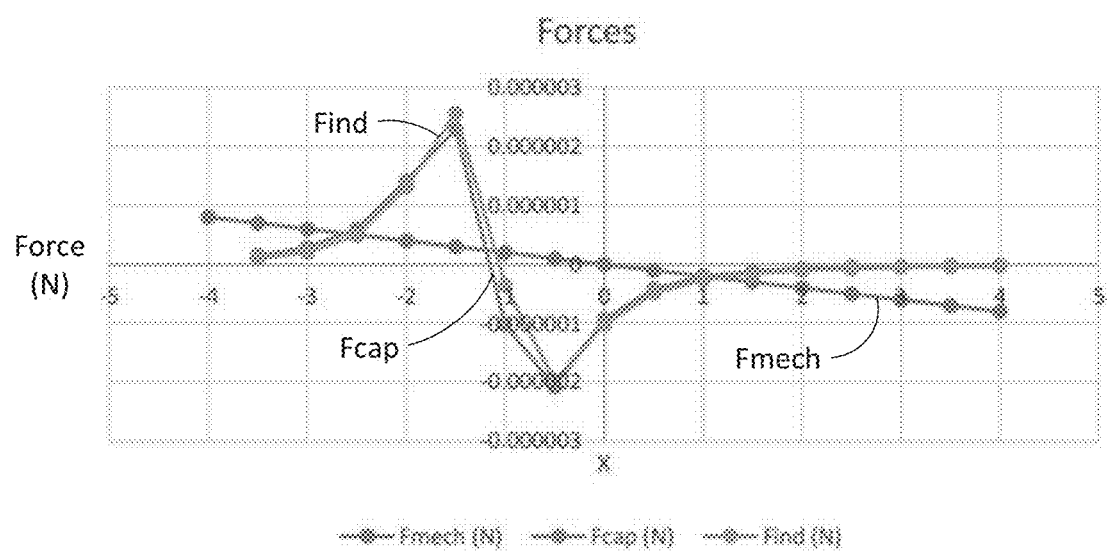

FIGS. 7A-D show configurations of the figures for a case where the applied frequency w_app is larger or higher than the self-resonant frequency w_o=1/SQRT(L_o*C_o). FIG. 7C indicates that the electric and magnetic energy reaches a peak at the point x=−2, corresponding to a displacement of both the tunable inductor element and tunable capacitor element of −2 um away from its unloaded equilibrium position. FIG. 7D shows the forces on each of the tunable inductor elements, with the mechanical restoring force increasing linearly in magnitude with displacement x but in a positive direction, opposing motion in the −x direction. FIG. 7D also shows the electromagnetic forces on the tunable inductor and capacitor elements, respectively, indicating large positive forces in the x direction to the left of x=−2 um, and large negative forces to the right of point x=−2 um. The net force on each self-tuning element is zero and reaches a new equilibrium at or near x=−2 um. The equilibrium is stable since displacements <−2 um lead to forces in the +x direction, while displacements >−2 um lead to forces in the −x direction, bringing each element back to equilibrium. FIG. 7B shows the current in the inductor and voltage across the capacitor peak at the point x=−2 um, and FIG. 7A shows that x=−2 um is indeed a resonance point since at this value the inductive reactance X_L is equal to the capacitive reactance X_C and the total impedance of the series RLC circuit is at a minimum. In a preferred embodiment, when changing signal frequencies, the applied AC signal frequency is continuously swept or switched in small discrete steps so as to keep the self-tuning circuit in a state near resonance with larger electromagnetic forces to effect self-tuning.

The self-tuning impedance matching circuit including self-tuning inductors and/or capacitors may be configured to have (i) a lower Q when the self-tuning reactive elements are in a position away from a desired resonance frequency and (ii) a higher Q value when the self-tuning reactive elements are in a position at or near a desired resonance frequency. This broadens the applicable frequency range for self-tuning by providing a broader resonance peak vs. position away from resonance, while providing more energy storage and higher electrical forces close to a desired resonant frequency. The self-tuning circuits can further improve the Q factor by connecting with a resonator element such as a mechanical resonator or piezoelectric resonator, for example in series between a tunable capacitor and a tunable inductor.

Figure 8:
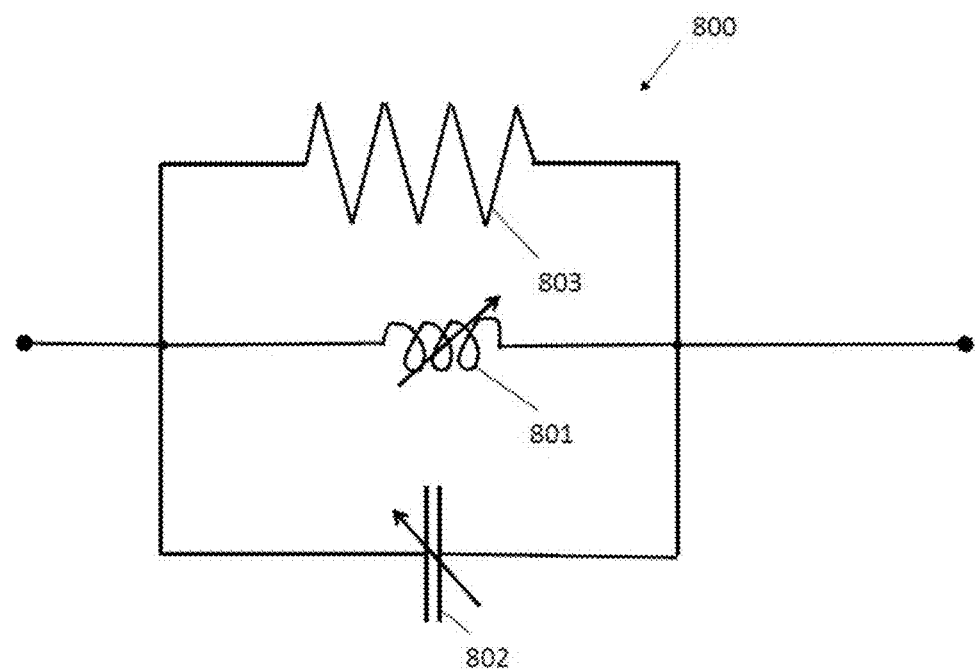
FIG. 8 is a schematic diagram of a parallel RLC circuit including tunable inductive and capacitive elements, in accordance with embodiments of the present invention.

FIG. 8 shows a schematic diagram of a parallel RLC circuit 800 in which the inductance L 801 and capacitance C 802 include tunable inductive and capacitive elements, respectively. Without an applied load, the parallel RLC self-tuning circuit has an unloaded self-resonant frequency given by w_o=1/SQRT(L_o*C_o), where L_o and C_o are respective values of inductance and capacitance for elements in an electrically unloaded, mechanical equilibrium state. In a preferred embodiment, the resistance R 803 is made as high as possible while the inductance L_o is preferably small relative to the capacitance C_o in order to provide a high Q factor, which is a measure of the stored electromagnetic energy to the energy dissipated per cycle. The Q factor for an RLC parallel circuit is given by Q=R*SQRT(C/L). In order to increase the Q factor, the capacitance can be increased by adding a high Q fixed capacitance C_F in parallel with a high Q tunable capacitor element C_tun and by using a large value resistor, R.

Figure 9A:
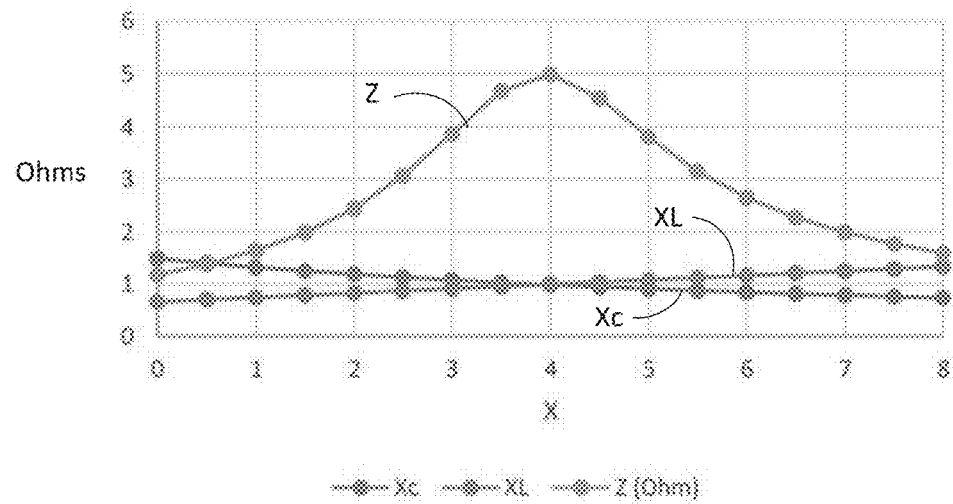
FIGS. 9A-D show the reactances and impedances, voltage across the capacitor and current in the inductor, energy stored in the capacitor and inductor, and resulting electromagnetic and mechanical restoring forces as a function of the displacement of the tunable inductor and capacitor element from its equilibrium position, in accordance with an embodiment of the present self-tuning circuit.
Figure 9B:
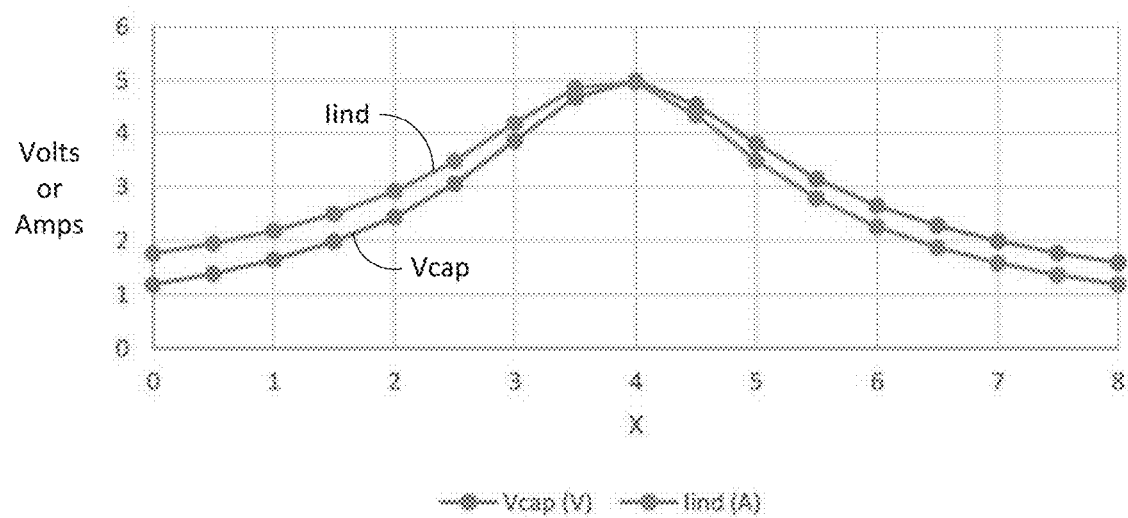
Figure 9C:
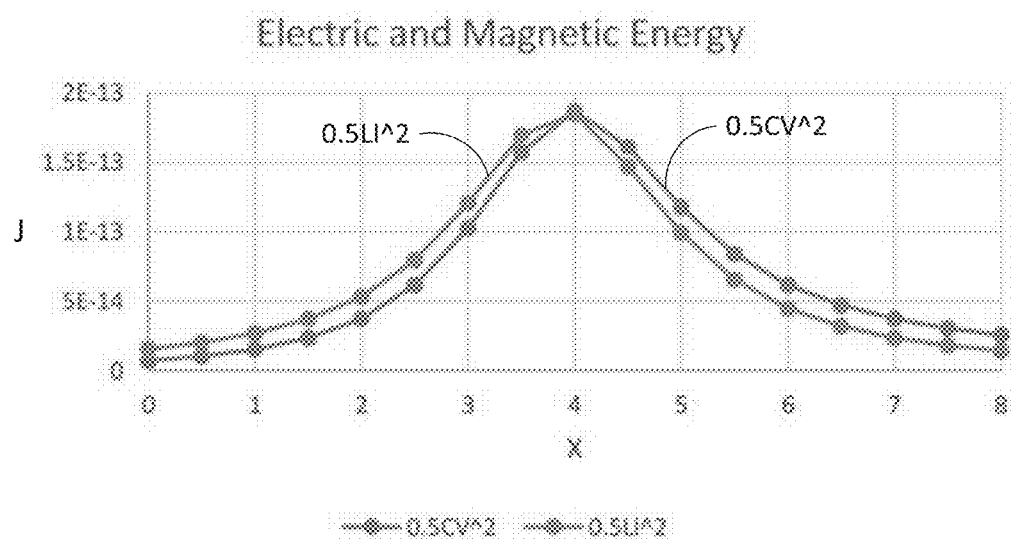
Figure 9D:
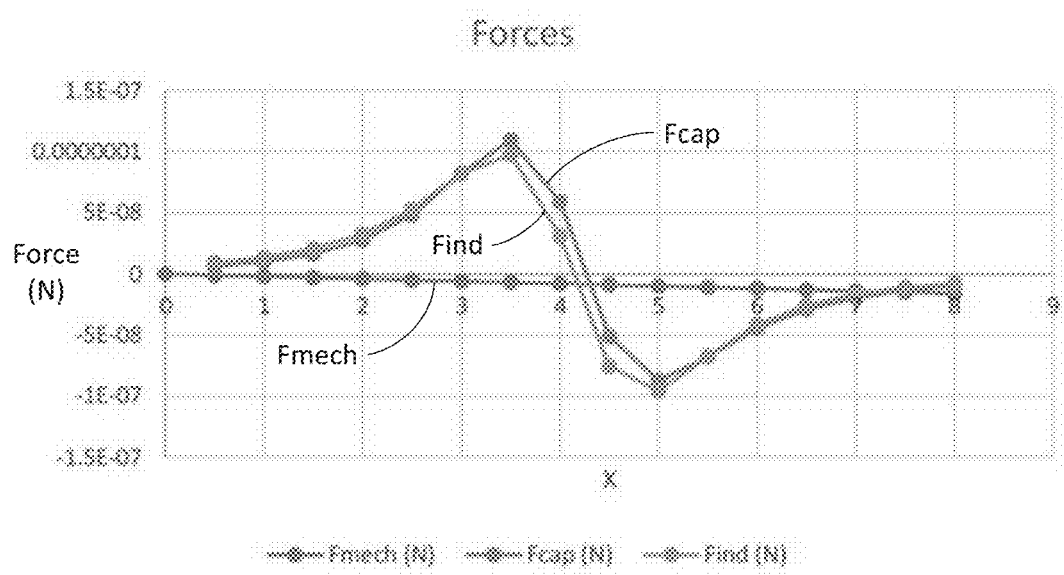

When a constant magnitude AC current is applied across the self-tuning parallel RLC circuit of FIG. 8, energy is alternately stored in the capacitor and inductor with oscillations at the applied frequency w_app. The energy in the capacitor and inductor MEMS elements leads to electromagnetic forces given by F_EM=dU_EM/dx, where U_EM is the electromagnetic energy in a given element, and dU_EM/dx is the derivative of electromagnetic energy with respect to X, the direction of allowed motion of the tunable elements. FIGS. 9A-D show the reactances and impedances (FIG. 9A), voltage across the capacitor and current magnitude in the inductor (FIG. 9B), energy stored in the capacitor and inductor (FIG. 9C), and resulting electromagnetic and mechanical restoring forces as a function of x, the displacement of each tunable inductor and capacitor element from its respective equilibrium position (FIG. 9D) for the parallel RLC circuit 800 in FIG. 8, with an AC current of constant magnitude applied thereto. FIG. 9C indicates that the electric and magnetic energy reaches a peak at the point x=4, corresponding to a displacement of both the tunable inductor element and tunable capacitor element of 4 um away from its respective unloaded equilibrium position. FIG. 9D shows the forces on each of the tunable inductor elements, with the mechanical restoring force increasing linearly in magnitude with displacement x but in a negative direction, opposing motion in the +x direction. FIG. 9D also shows the electromagnetic forces on the tunable inductor and capacitor elements, respectively, indicating large positive forces in the +x direction up to x=4 um, and large negative forces beyond the point x=4 um. The net force on each self-tuning element is zero and reaches a new equilibrium at or near x=4 um. The equilibrium is stable since displacements <4 um lead to forces in the +x direction, while displacements >4 um lead to forces in the −x direction, bringing each element back to equilibrium. FIG. 9B shows the current in the inductor and voltage across the capacitor peak at the point x=4 um, and FIG. 9A shows that x=4 um is indeed a resonance point since at this value the inductive reactance X_L is equal to the capacitive reactance X_C and the total impedance of the parallel RLC circuit is at a maximum. The parallel RLC circuit serves as an anti-resonance circuit or rejector circuit, providing high impedance at its resonant frequency and minimizing the signal passed through the parallel circuit configuration of FIG. 8.

Figure 10:
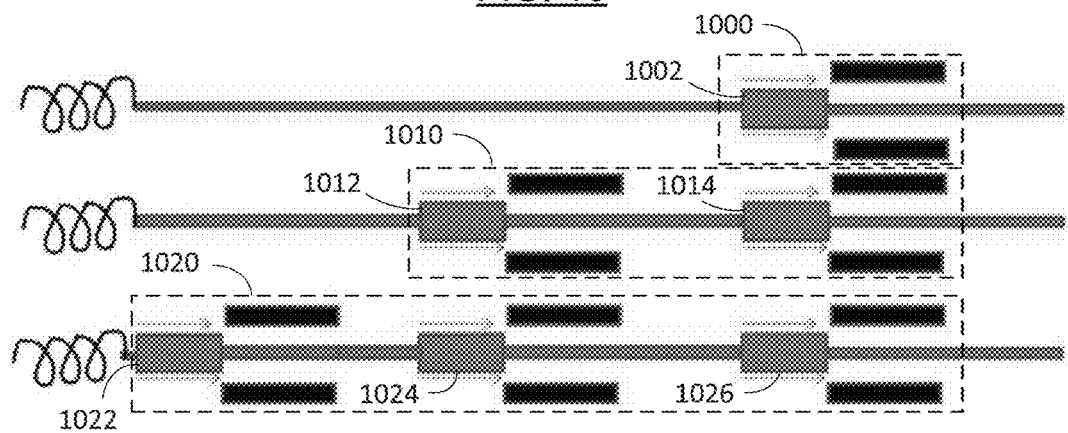
FIGS. 10-13 show embodiments of the present invention using multiple inductor or capacitor elements to provide additional tuning ranges.
Figure 11:
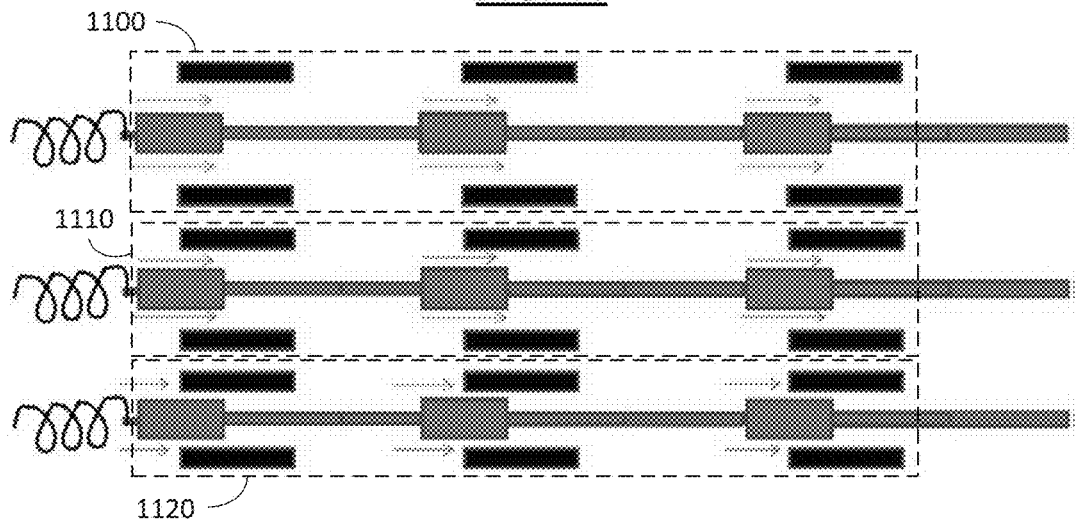
Figure 12:
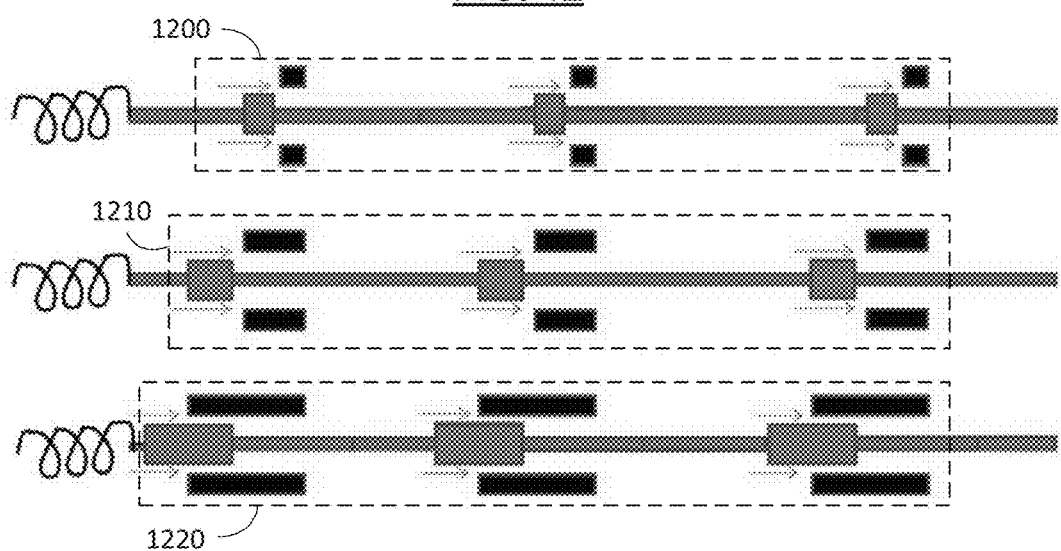
Figure 13:
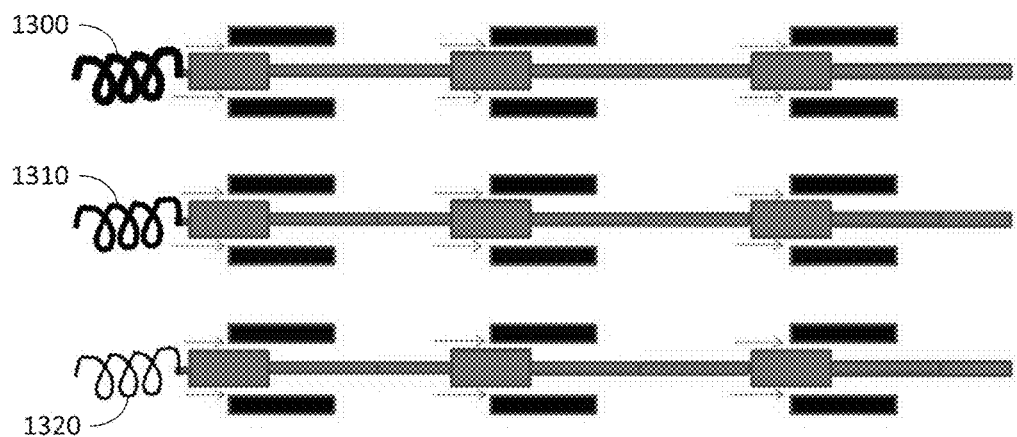

If resonance is not reached within the displacement that causes elements to align with maximum stored magnetic or electric energy, the element will remain in stable equilibrium with fields aligned but will not reach resonance. What is needed is a method to extend the range of tuning of the elements as additional electromagnetic energy is available to tune to resonance. One or more additional tuning ranges can be provided through several methods by using multiple inductor elements (e.g., in series) or capacitor elements (e.g., in parallel), including (1) varying the number of elements (i.e., inductors and/or capacitors 1002, 1012, 1014, 1022, 1024 and 1026) within a given segment 1000, 1010 or 1020, as shown in FIG. 10, (2) varying the gap spacing between elements within given segments 1100, 1110 or 1120, as shown in FIG. 11, (3) varying the size of the elements within a given segment 1200, 1210 or 1220, as shown in FIG. 12, and (4) varying the mechanical restoring force between given segments by using mechanical springs 1300, 1310 and 1320 with different spring constants as shown in FIG. 13. In each of the structures and/or methods shown in FIGS. 10 through 12, the electromagnetic energy and resulting electromagnetic forces differ among each segment due to the different numbers of elements (FIG. 10), the different gaps between elements (FIG. 11), and the different element sizes (FIG. 12). In FIG. 13, the electromagnetic energy and resulting electromagnetic forces are the same within each segment, but the mechanical restoring force is different due to the use of different springs with different spring constants. With these structures and/or methods, it is possible to extend the tuning range(s) of inductance and capacitance within self-tuning microelectromechanical circuits by providing additional tuning with more or less available electromagnetic energy.

While the examples shown indicate particular examples of self-tuning inductors and capacitors, they do not limit the scope of the invention. Other conditions not explicitly stated may also facilitate self-tuning circuits. Therefore, the examples described herein and shown in the Figures do not limit the scope of the invention.

The above discussion describes fully passive self-tuning impedance matching circuits. In some cases, is may be advantageous to provide active tuning to the self-tuning circuits to more quickly move to resonance, to provide fine tuning to resonance, to significantly change the range of tuning (e.g., to a different band), or to actively de-tune the circuit from resonance. FIG. 14A shows a configuration of a tunable inductor element, and FIG. 15A shows a configuration of a tunable capacitor element, each of which also provides for active tuning of each element independently through the use of comb actuators. Tunable inductor 1400 in FIG. 14A includes primary tuning inductor element 1408 between fixed inductor elements 1420*a-b* and connected to comb drives 1411 and 1412, each of which includes fixed comb elements 1413 and 1414 and movable comb elements 1415 and 1416. The moveable portions 1415 and 1416 are, in turn, connected to flexible springs 1409 and 1410, which are anchored to the substrate with anchors 1403 and 1404 at opposite ends of the tunable inductor 1400. The tuning inductor element 1408 and fixed inductor elements 1420*a-b* each comprises a vertical serpentine structure, as described and shown elsewhere herein.

Similarly, tunable capacitor 1500 in FIG. 15A includes primary tuning capacitor elements 1508*a-b* connected to comb drives 1511 and 1512, each of which includes fixed comb elements 1513 and 1514 and movable comb elements 1515 and 1516. The moveable portions 1515 and 1516 are, in turn, connected to flexible springs 1509 and 1510, which are anchored to the substrate with anchors 1503 and 1504 at opposite ends of the tunable capacitor 1500. Comb drives 1411, 1412, 1511, and 1512 can be used to fine tune the displacement of tunable inductor or capacitor elements, respectively, or can de-tune the circuit away from resonance as desired.

Figure 14B:
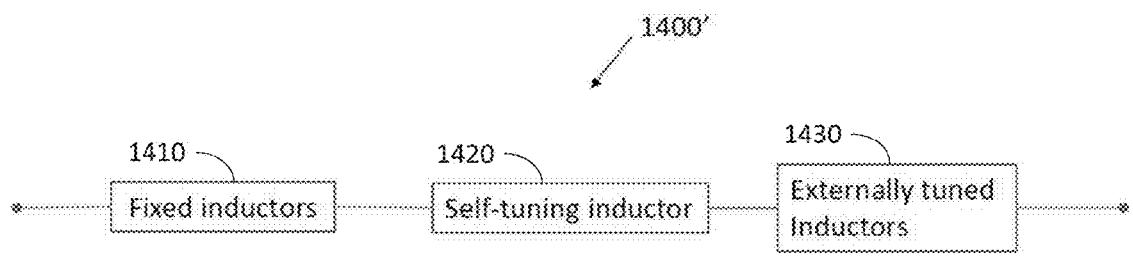
Figure 15B:
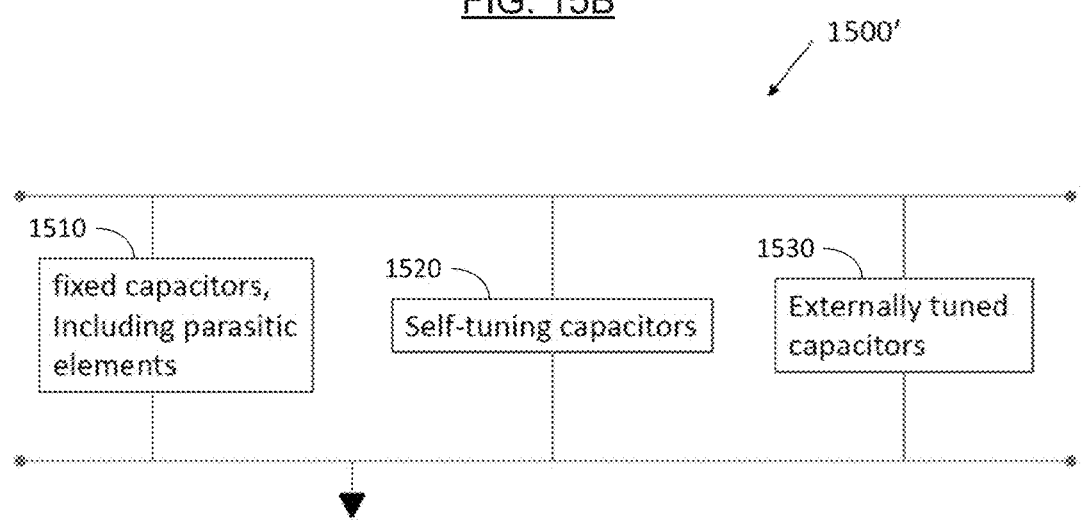

FIGS. 14B and 15B show that lumped circuit elements 1420, 1430, 1520, 1530 and externally tunable capacitive and/or inductive elements 1440, 1540 may be connected within self-tuning circuits 1400', 1500' to provide and modify tuning ranges in which the circuits 1400', 1500' self-tune. The fixed inductors 1420 include parasitic elements. While FIG. 14B shows inductor elements 1420-1440 in series, and FIG. 15B shows capacitor elements 1520-1540 in parallel, other configurations are possible within the scope of the present invention and should not be construed as limiting the scope of the invention.

Figure 16:
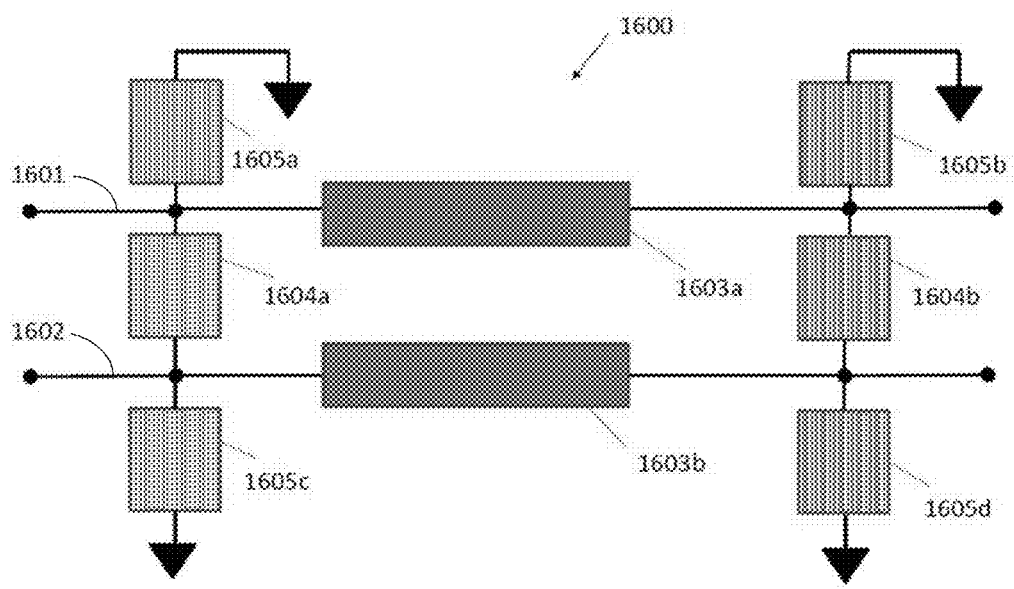
FIG. 16 shows a diagram of a circuit including self-tuning microelectromechanical impedance matching circuits and signal lines driven at different frequencies, in accordance with embodiments of the present invention.

FIG. 16 shows the use of self-tuning microelectromechanical impedance matching circuits within and between signal lines of differing frequencies. FIG. 16 shows a circuit 1600 including a first signal line 1601 driven at a first frequency and a second signal line 1602 driven at a second frequency different from the first frequency. Circuit 1600 includes self-turning MEMS series RLC circuits 1603*a-b* which self-tune the signal line impedance toward resonance at the applied driving frequency within each respective signal line. Circuit 1600 also includes anti-resonant or rejector self-tuning MEMS parallel RLC circuits 1604*a-b* and 1605*a-d*. Anti-resonant parallel RLC circuits 1604*a-b* are connected between channels and self-tune to an anti-resonance corresponding to the difference in frequency between channels, and thereby also provide a high impedance between signal lines, increasing signal isolation and reducing cross-talk. Anti-resonant parallel RLC circuits 1605*a-d* are connected between signal and ground lines and self-tune to provide a desired or uniform impedance to ground, such as 50 Ohms.

Figure 17:
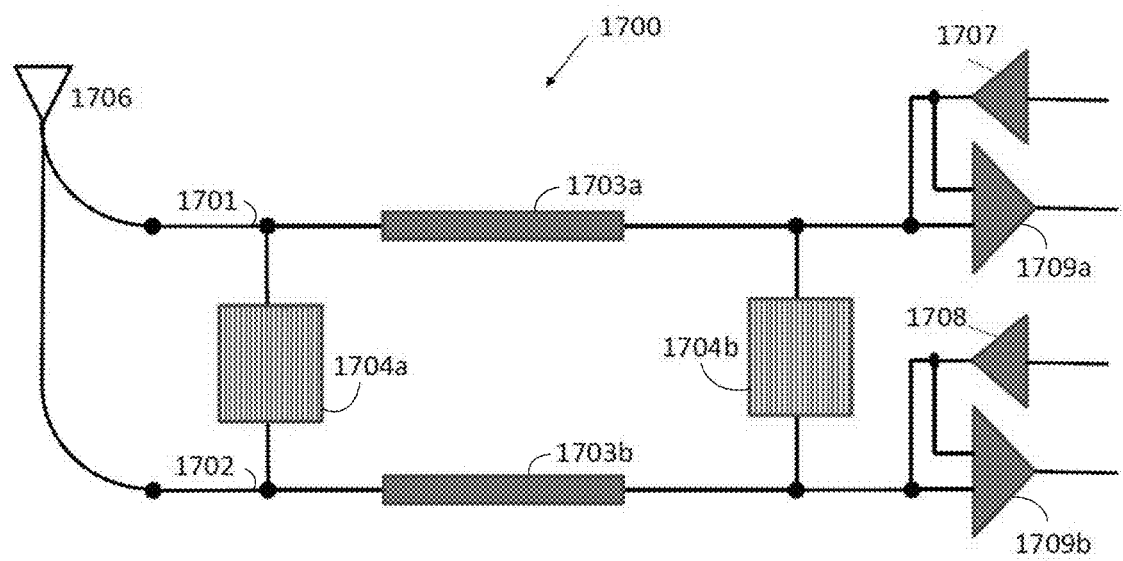
FIG. 17 is a diagram of a system of RF or other AC signal channels, each employing a separate frequency, including series RLC circuit elements in which the resistance is as low as possible and the self-tuning inductive and capacitive MEMS elements are in accordance with embodiments of the present invention.

A system of RF signal channels 1700 using the present self-tuning MEMS impedance matching circuits is shown in FIG. 17. While the example indicates radio frequency (RF) signals, the invention applies to signals having any of a broad range of frequencies, of which RF is a subset. Each channel employs a separate frequency which differs from the frequency in an adjacent channel by dw. FIG. 17 shows 2 channels 1701 and 1702 for clarification, but the system can be extended to multiple adjacent channels with channel frequencies differing by dw. Within each channel between the antenna 1706 and receiver circuitry 1709*a-b* (e.g., one or more amplifiers and/or buffers), there is a series RLC circuit element 1703*a* or 1703*b*, in which the resistance R is made as low as possible and the L and C circuit elements are self-tuning inductive and capacitive MEMS elements, respectively. Between the channels 1701 and 1702, there are parallel RLC circuit elements 1704*a-b* connected between the adjacent channels, in which the resistance R is made high (e.g., a high value of characteristic line impedance), and the parallel L and C circuit elements are self-tuning inductive and capacitive MEMS elements, respectively. The series RLC circuit elements 1703*a-b* are designed with an unloaded self-resonant frequency near the target resonance frequency of a given channel. The parallel RLC circuit elements 1704*a-b* are designed with an unloaded self-resonant frequency near the frequency difference dw between adjacent channels. During signal reception from the antenna 1706, each series RLC circuit element 1703*a-b* is driven by a sinusoidal voltage source 1707 and 1708 of constant magnitude Vo at the separate frequencies corresponding to each channel. The constant voltage magnitude Vo may be adjustable by circuit amplifiers and controlled by digital and/or analog circuitry. The sinusoidal voltage signal 1707 or 1708 driven from the far end (opposite the antenna) of each channel 1701 or 1702 causes the self-tuning inductive and capacitive MEMS elements in the corresponding series circuit 1703*a* or 1703*b* to self-tune to the applied driving frequency. Each series RLC circuit channel is connected in parallel to the antenna 1706 at the near end. Each self-tuned series RLC circuit channel serves as a tunable filter for RF signals received by the antenna. The far end (opposite the antenna) of each series RLC circuit channel is split into two circuit paths, a first circuit path transmitting the sinusoidal voltage signal driven by the voltage source 1707 or 1708 at the channel frequency, and a second circuit path receiving the signal into the first input of a signal comparator 1709*a* or 1709*b*. An output signal from the sinusoidal voltage 1707 or 1708 driven at the channel frequency is connected to the second input of the signal comparator 1709a or 1709b. The signal comparator 1709a-b measures the difference between the sinusoidal driving signal 1707 or 1708 and the series RLC signal connected to the antenna, and in this way, can measure the antenna signal for the channel frequency of interest.

The parallel RLC circuit elements 1704a-b connected between adjacent channels experience a current source input and self-tune to a resonant frequency corresponding to the frequency difference dw between the channels 1701 and 1702. The parallel RLC circuit elements 1704a-b function as rejector or anti-resonance circuits, providing high impedance to the AC current being applied at its terminals. In this way, the parallel RLC circuit elements 1704a-b help to filter out signals from adjacent channels. The combination of series RLC circuit elements 1703a-b self-tuned to an applied channel frequency and parallel RLC circuit elements 1704a-b self-tuned to the frequency difference between channels provides an effective band pass filter centered at the applied channel frequency while blocking adjacent channel frequencies.

The RF signal circuitry as shown in FIG. 17 may allow signal reception on multiple channels simultaneously.

Figure 18:
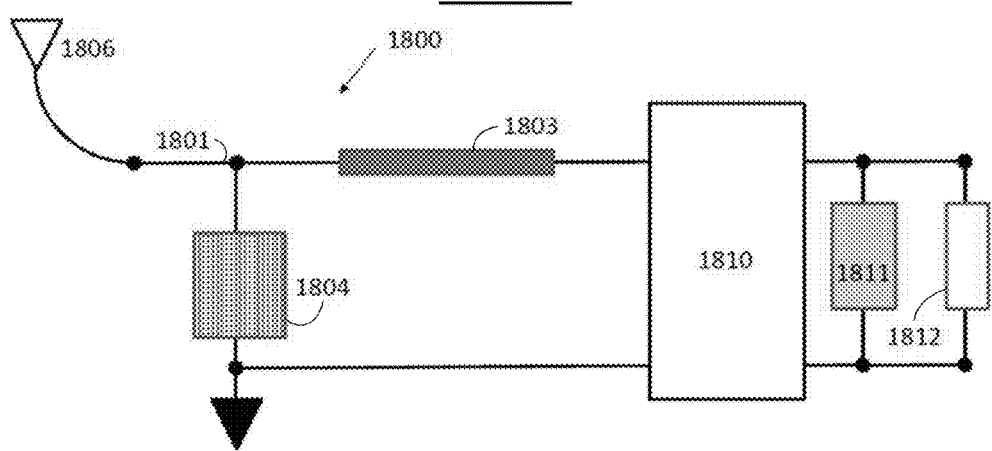
FIG. 18 shows a diagram of an energy harvesting circuit, including self-tuning MEMS circuits in series and in parallel, connected between an antenna and a voltage rectifying device, and further including an energy storage unit, in accordance with embodiments of the present invention.
Figure 19:
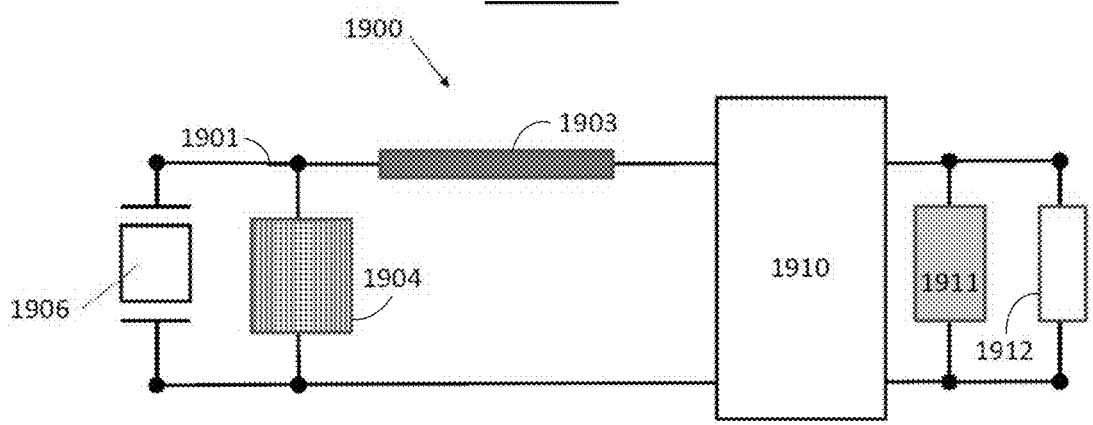
FIG. 19 shows a diagram of an energy harvesting device including self-tuning MEMS circuits in series and in parallel, connected between a piezoelectric energy harvesting device and a voltage rectifying device, and further including an energy storage unit, in accordance with embodiments of the present invention.

Self-tuning MEMS circuits can be used in energy harvesting or energy scavenging devices to tune electrical impedance of a harvesting circuit to the applied electromagnetic energy. FIG. 18 shows an RF energy harvesting circuit 1800 that uses self-tuning MEMS impedance matching in accordance with embodiments of the present invention, and FIG. 19 shows a piezoelectric harvesting circuit 1900 using self-tuning MEMS impedance matching in accordance with other embodiments of the present invention. As shown in FIG. 18, self-tuning MEMS circuits 1803 in series and 1804 in parallel can be connected between an antenna 1806 and a voltage rectifying device 1810 and storage unit 1811 such as a battery or supercapacitor, to improve the efficiency of energy harvesting at different frequencies. As similarly shown in FIG. 19, self-tuning MEMS circuits 1903 in series and 1904 in parallel can be connected between a piezoelectric energy harvesting device 1906 and a voltage rectifying device 1910 and storage unit 1911 such as a battery or supercapacitor, in order to match impedance of the piezoelectric energy harvester and maximize power transfer to the storage circuit and electrical load 1912. However, in some applications, the circuits 1800 and 1900 may include only a series-connected circuit 1803 or 1903 or a parallel-connected circuit 1804 or 1904, rather than both the series- and parallel-connected circuits 1803 and 1804 or 1903 and 1904.

Figure 20:
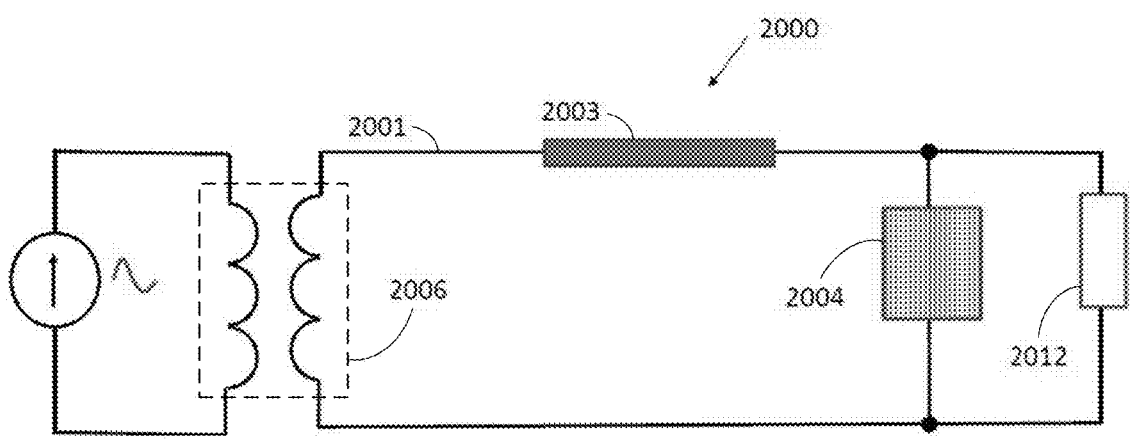
FIG. 20 shows a diagram of a transformer including self-tuning MEMS circuits in series and in parallel, connected to at least one side of a wireless, inductively-coupled circuit, in accordance with embodiments of the present invention.

In addition, FIG. 20 shows an inductively coupled circuit 2000 using self-tuning MEMS impedance matching in accordance with further embodiments of the present invention. As shown in FIG. 20, self-tuning series MEMS circuit 2003 and self-tuning parallel MEMS circuit 2004 can be connected to at least one side of a wireless inductively coupled power transformer or other inductively coupled circuit 2006 in order to tune the impedance of the wireless circuit 2006 and maximize power transfer to a load 2012. Similar to the circuits 1800 and 1900, in some applications, the inductively coupled circuit 2000 may include only a series-connected circuit 2003 or a parallel-connected circuit 2004, instead of both the series- and parallel-connected circuits 2003 and 2004.

Figure 21A:
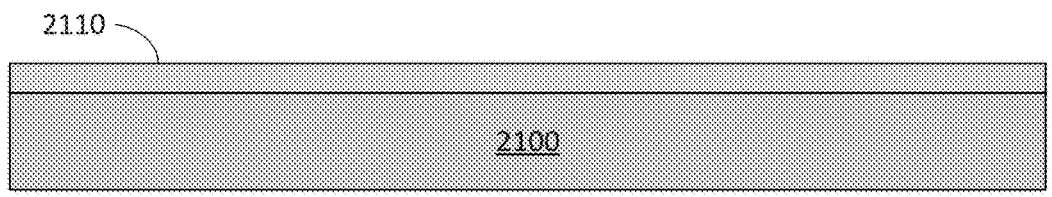
FIGS. 21A-U show cross-sections of structures made in an exemplary fabrication process for self-tuning inductor and capacitor elements in accordance with embodiments of the present invention.
Figure 21B:
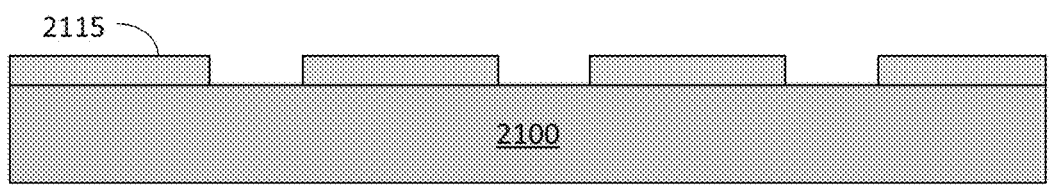
Figure 21C:
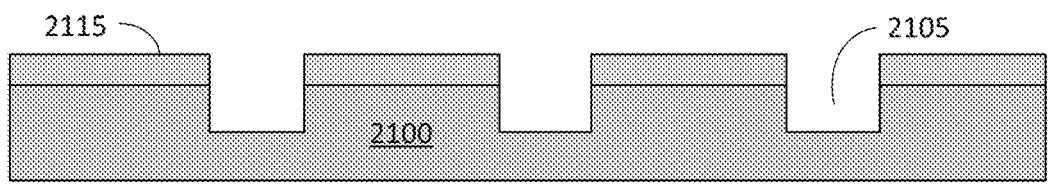
Figure 21D:
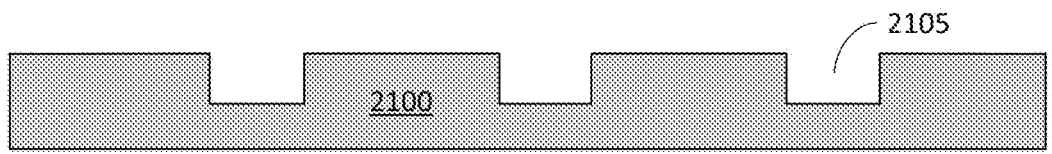
Figure 21E:
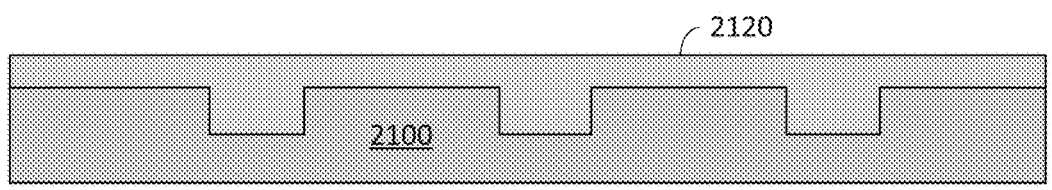
Figure 21F:
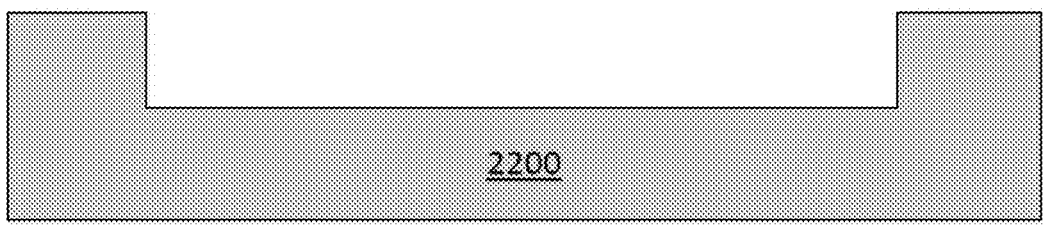
Figure 21G:
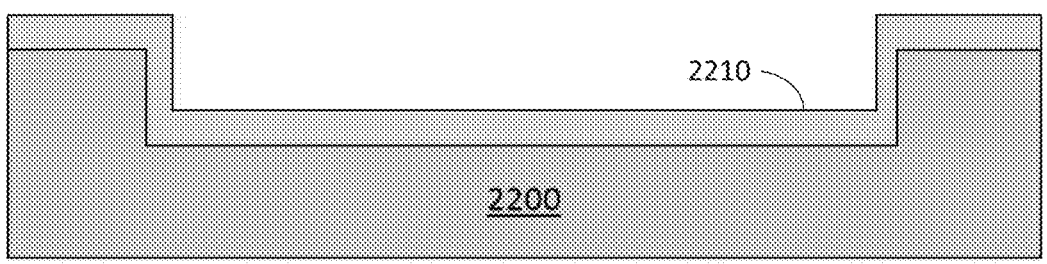
Figure 21H:
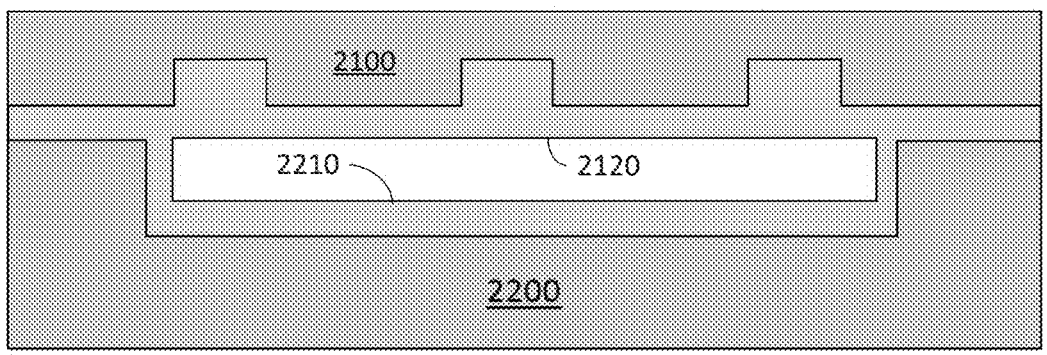
Figure 21I:
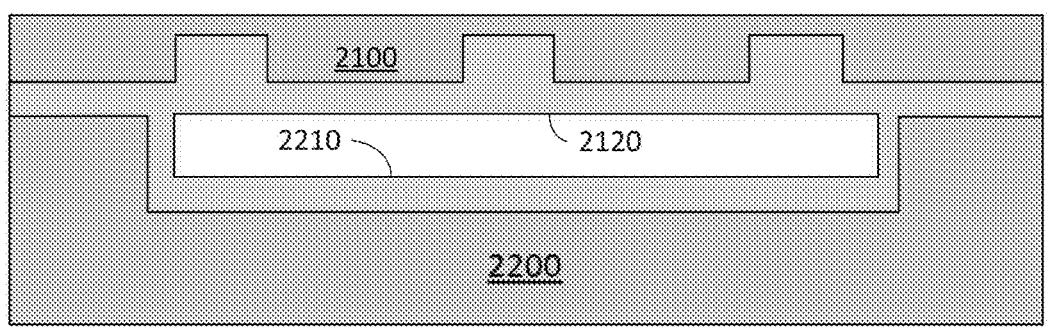
Figure 21J:
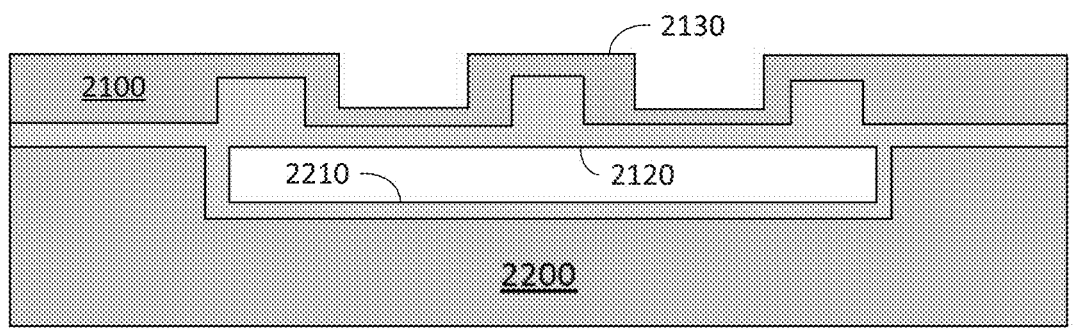
Figure 21K:
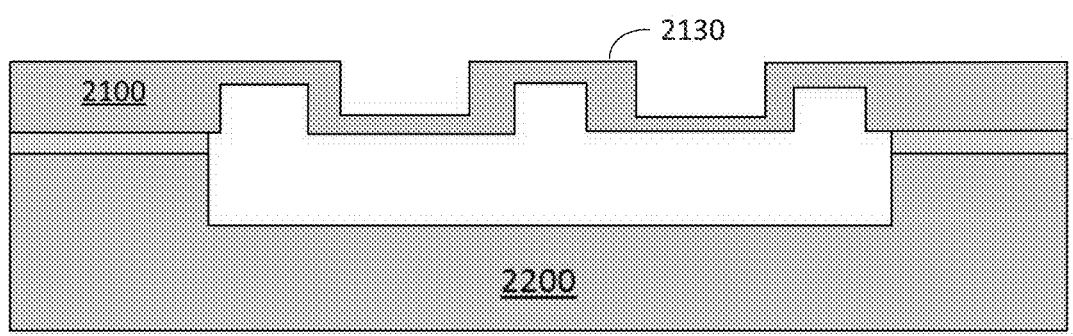
Figure 21L:
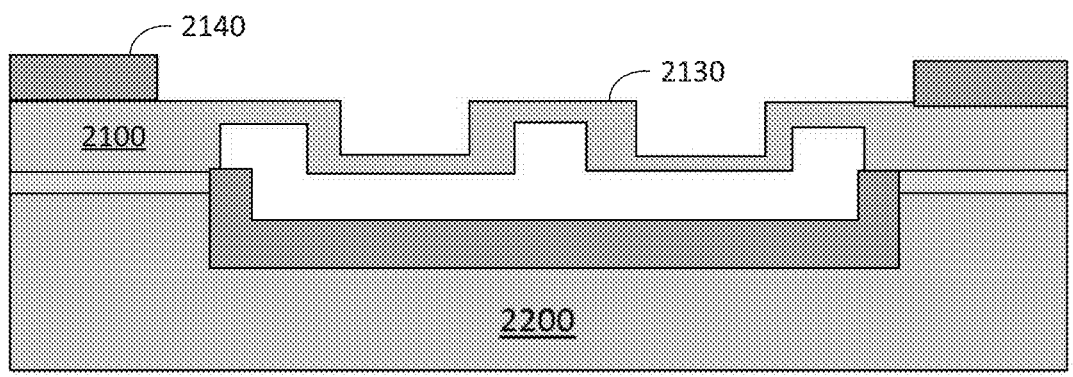
Figure 21M:
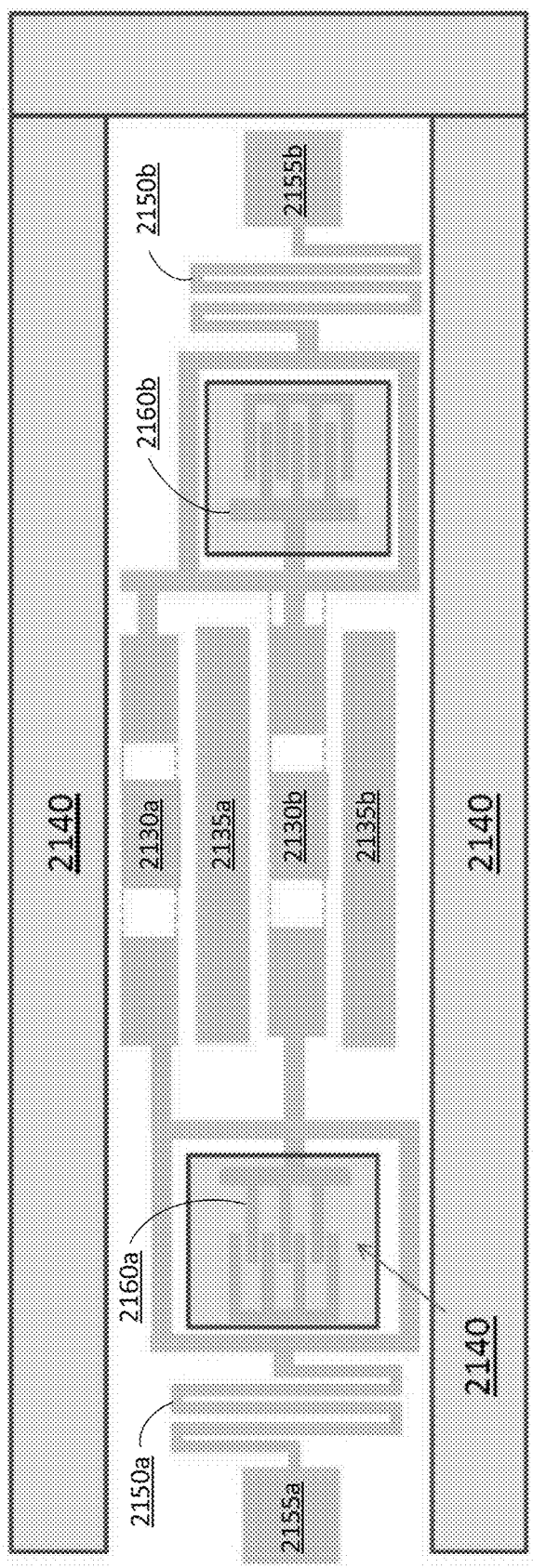
Figure 21N:
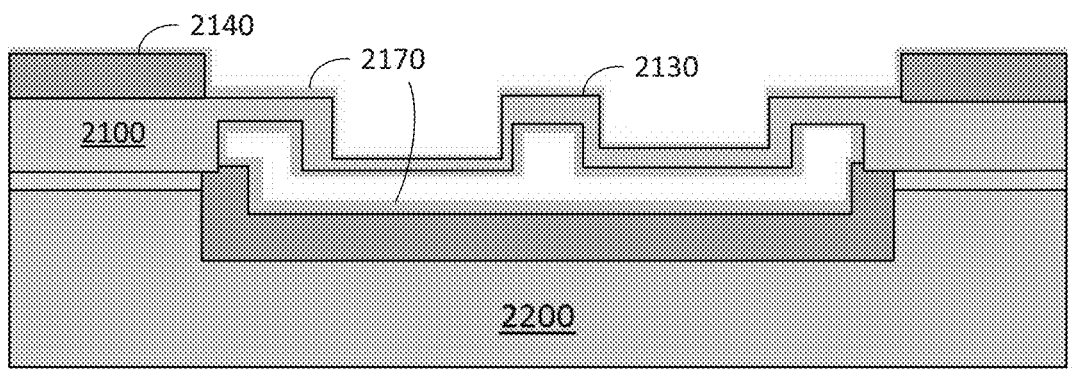
Figure 21O:
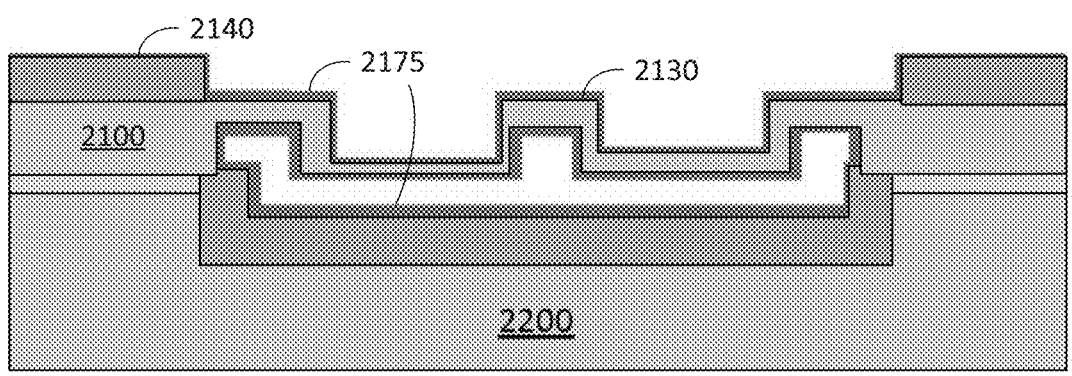
Figure 21P:
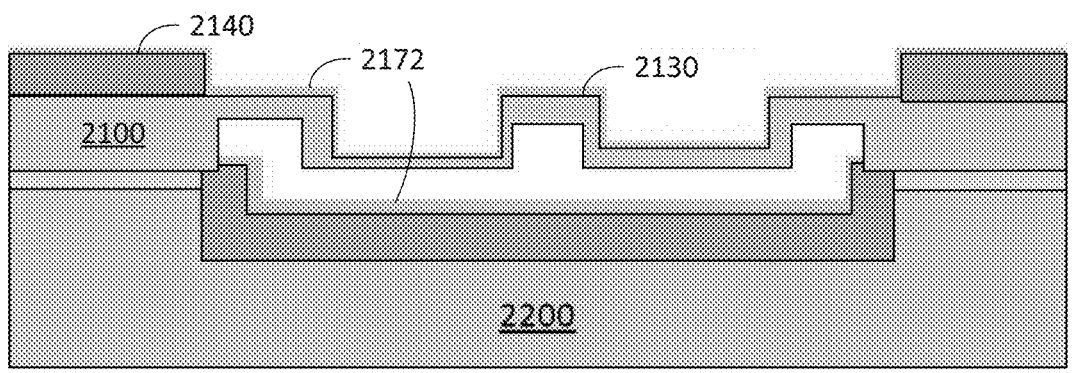
Figure 21Q:
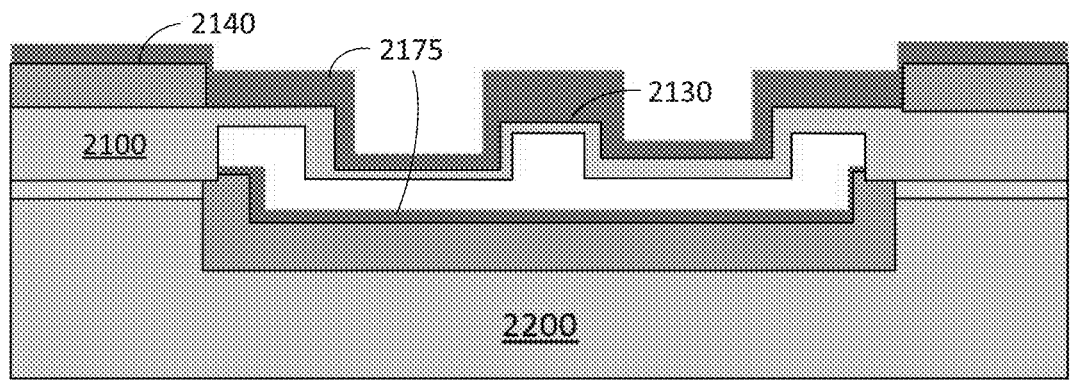
Figure 21R:
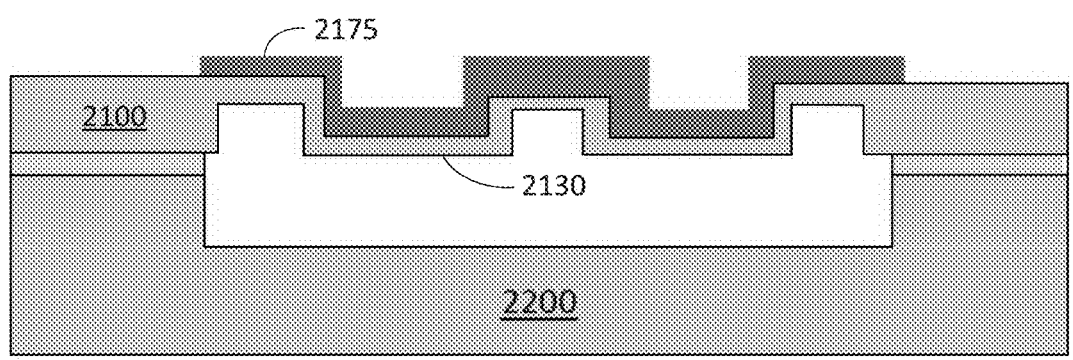
Figure 21S:
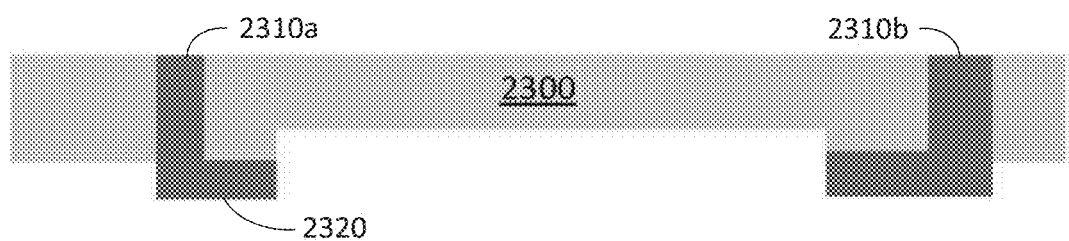
Figure 21T:
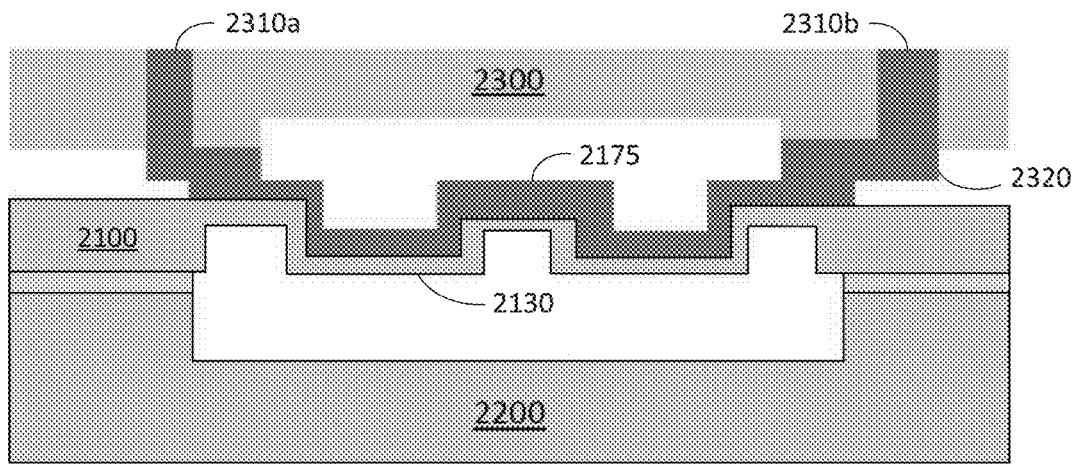
Figure 21U:
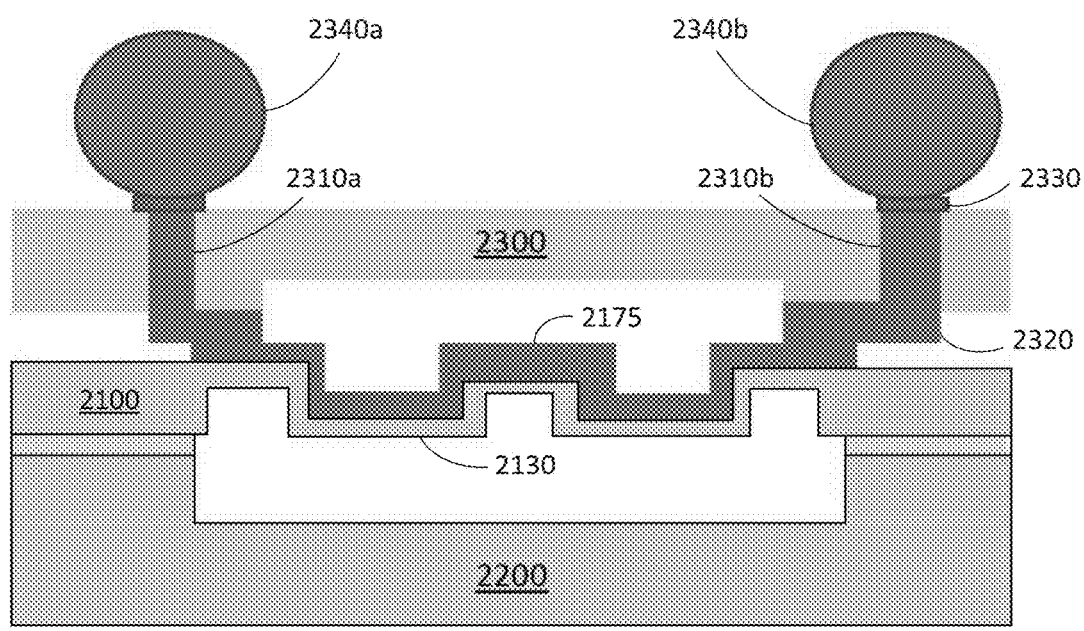

FIGS. 21A-U show an exemplary fabrication process for the self-tuning inductor and capacitor elements. Except for FIG. 21M, all structures shown in FIGS. 21A-U are side and/or cross-sectional views of the structure(s).

FIG. 21A shows an oxide layer 2110 (e.g., ~1 µm thick) deposited or grown on a silicon wafer 2100. In FIG. 21B, the oxide layer is patterned and etched to form an oxide mask 2115. FIG. 21C shows partial etching of the silicon 2100 wafer to form trenches 2105. The oxide mask is removed in FIG. 21D. FIG. 21E shows a new oxide layer 2120 deposited and polished (e.g., by chemical-mechanical polishing [CMP]), and FIG. 21F shows a second silicon wafer 2200 that has been patterned (e.g., by printing or photolithography) and partially etched (e.g., by wet or dry etching the exposed region[s] of the second wafer). In FIG. 21G, an oxide layer 2210 is grown or deposited on the second silicon wafer 2200, and in FIG. 21H, the second silicon wafer 2200 is fusion bonded face-to-face to the oxide layer 2120 of the first wafer 2100.

In FIG. 21I, the first wafer 2100 is ground, polished and/or wet etched to reduce its thickness T. FIG. 21J shows the wafer stack in which the backside of the first wafer 2100 is patterned and etched to form the anchored tunable reactance mechanical structures 2130. Exposed portions of the oxide layer(s) 2120 and 2210 are removed (e.g., by wet etching) as shown in FIG. 21K.

In FIG. 21L, photoresist 2140 is deposited (including in the trench or slot in the second wafer 2200) and patterned to expose areas on the first wafer 2100 (including the tunable reactance mechanical structures 2130a-b) to be plated with metal. FIG. 21M shows a top view of the exposed areas of the tunable reactance device to be plated with metal and the areas of the tunable reactance device covered with photoresist 2140. Vertical reactance elements (e.g., including the tunable reactance structures 2130a-b and finger structures [fixed reactance structures] 2135a-b), posts 2155a-b and springs 2150a-b are exposed. The comb drives 2160a-b and areas of the first wafer 2100 where electrical connections (e.g., buses) may be formed are covered. In FIG. 21N, a barrier and/or seed layer 2170 (which may comprise a barrier metal or conductive material) is deposited using CVD and/or ALD. A bulk metal 2175 such as copper is plated on the barrier and/or seed layer 2170 in FIG. 21O.

FIG. 21P shows an alternative to FIG. 21N, in which the barrier and/or seed layer 2172 is directionally sputtered on top of the tunable reactance mechanical structures and in the trench in the second wafer. FIG. 21O shows the alternative embodiment after plating a metal (e.g., copper) layer 2177, similar to FIG. 21O. In FIG. 21R, the photoresist 2140 and unwanted metal from layers 2170/2175 or 2172/2177 is removed (e.g., by a lift-off process).

FIG. 21S shows a MEMS cap wafer or CMOS circuit wafer 2300 that may include CMOS circuitry (not shown) with through silicon vias (TSVs) 2310a-b and a preferably copper seal ring 2320 surrounding a central trench or depression 2305 in the wafer 2300. FIG. 21T shows the CMOS or MEMS cap wafer 2300 bonded to the tunable reactive device wafer 2100 using thermocompression or eutectic bonding. FIG. 21U shows an under-bump metallization (UBM) 2330 deposited on TSV bond pads and solder spheres 2340a-b on the UBM 2330 to form a wafer-level chip scale package including the tunable reactance devices 2130 according to embodiments of the present invention.

Figure 4:
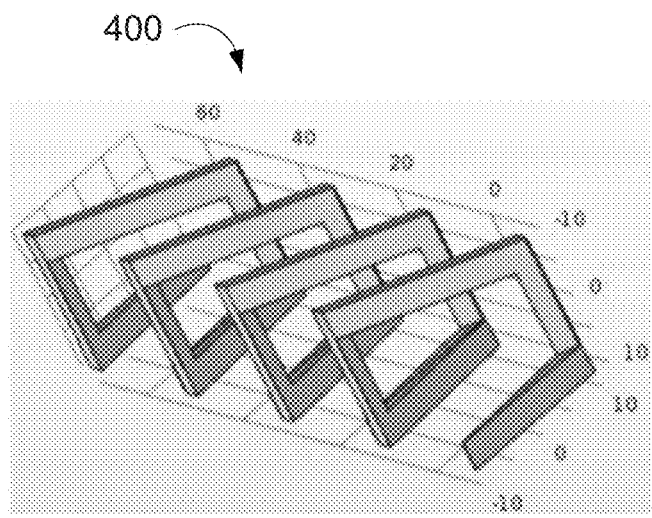
FIG. 4 shows a high Q vertical spiral inductor element in accordance with embodiments of the present invention that can be added in series with a tunable inductor and that can also be used in a self-tuning MEMS circuit simultaneously as a mechanical spring and tunable inductor.

The fabrication process can provide for high Q inductors that can be moved and tuned like that shown in FIG. 4, as well as fixed inductors. Similarly, high Q tunable and/or fixed capacitors can be provided in place of or in addition to tunable and fixed inductors using the same fabrication process.

Self-tuning MEMS circuits can be made from high conductivity materials such as copper, silver, gold, aluminum, platinum, titanium, tungsten, zinc, tin, nickel, graphene and from superconducting materials.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A self-tuning impedance-matching microelectromechanical circuit, comprising
   a) a self-tuning inductor element connected to a first mechanical spring and having a tunable reactance;
   b) a tunable or fixed capacitor;
   c) one or more electrical connections between the self-tuning inductor element and the tunable or fixed capacitor; and
   d) an AC signal source configured to (i) provide an AC signal to the self-tuning inductor element and the tunable or fixed capacitor, the AC signal having a frequency, and (ii) create an electromagnetic force on the self-tuning inductor element that moves the self-tuning inductor element and tunes the self-tuning impedance-matching circuit toward resonance with the AC signal.

2. The self-tuning impedance-matching circuit of claim 1, wherein the tunable or fixed capacitor comprises a self-tuning capacitor, and the self-tuning impedance-matching circuit further comprises an electrical connection between the self-tuning inductor element and the self-tuning capacitor.

3. The self-tuning impedance-matching circuit of claim 1, wherein the self-tuning inductor element is connected in series with the tunable or fixed capacitor.

4. The self-tuning impedance-matching circuit of claim 1, wherein the self-tuning inductor element is connected in parallel with the tunable or fixed capacitor.

5. A circuit comprising:
   at least one device selected from an antenna, an energy storage device, a piezoelectric energy harvester, a piezoelectric resonator, a MEMS resonator, and an inductively coupled circuit; and
   at least one self-tuning circuit of claim 1, directly or indirectly electromagnetically coupled to the at least one device.

6. The circuit of claim 5, wherein the at least one device comprises the inductively coupled circuit, the at least one self-tuning circuit comprises at least one self-tuning microelectromechanical impedance-matching circuit, and the circuit further comprises an electrical load receiving inductive power from the inductively coupled circuit and the at least one self-tuning microelectromechanical impedance-matching circuit.

7. A self-tuning impedance-matching microelectromechanical circuit, comprising
   a) a self-tuning capacitor element connected to a first mechanical spring and having a tunable reactance;
   b) an inductor;
   c) one or more electrical connections between the self-tuning capacitor element and the inductor; and
   d) an AC signal source configured to (i) provide an AC signal to the self-tuning capacitor element and the inductor, the AC signal having a frequency, and (ii) create an electromagnetic force on the self-tuning capacitor element that moves the self-tuning capacitor element and tunes the self-tuning impedance-matching circuit toward resonance with the AC signal.

8. The self-tuning impedance-matching circuit of claim 7, wherein the self-tuning capacitor element is connected in series with the inductor.

9. The self-tuning impedance-matching circuit of claim 7, wherein the self-tuning capacitor element is connected in parallel with the inductor.

10. A self-tuning impedance-matching microelectromechanical circuit, comprising
    a) a first tunable reactance element connected to a first mechanical spring and having a tunable reactance;
    b) a second tunable or fixed reactance element;
    c) one or more electrical connections between the first tunable reactance element and the second tunable or fixed reactance element, wherein all or part of the at least one electrical connection comprises a superconducting material; and
    d) an AC signal source configured to (i) provide an AC signal to the first tunable reactance element and the second tunable or fixed reactance element, the AC signal having a frequency, and (ii) create an electromagnetic force on the first tunable reactance element that moves the first tunable reactance element and tunes the self-tuning impedance-matching circuit toward resonance with the AC signal,
    wherein one of the first tunable reactance element and the second tunable or fixed reactance element comprises a capacitor and the other of the first tunable reactance element and the second tunable or fixed reactance element comprises an inductor.

11. The self-tuning impedance-matching circuit of claim 10, wherein the superconducting material comprises niobium-titanium, niobium-tin, YBaCuO, BiCaSrCuO, TlBaCuO, TlCaBaCuO, or HgCaBaCuO.

12. The self-tuning impedance-matching circuit of claim 10, comprising a series RLC circuit having a Q factor, wherein the superconducting material is cooled to increase the Q factor.

13. A self-tuning impedance-matching microelectromechanical circuit, comprising
    a) a first tunable reactance element connected to a first mechanical spring and having a tunable reactance;
    b) a second tunable or fixed reactance element;
    c) one or more electrical connections between the first tunable reactance element and the second tunable or fixed reactance element;
    d) an AC signal source configured to (i) provide an AC signal to the first tunable reactance element and the second tunable or fixed reactance element, the AC signal having a frequency, and (ii) create an electromagnetic force on the first tunable reactance element that moves the first tunable reactance element and tunes the self-tuning impedance-matching circuit toward resonance with the AC signal; and
    e) a plurality of actuator electrodes electrically coupled to the first tunable reactance element, configured to fine tune or de-tune the resonance of the self-tuning impedance-matching circuit,
    wherein one of the first tunable reactance element and the second tunable or fixed reactance element comprises a capacitor and the other of the first tunable reactance element and the second tunable or fixed reactance element comprises an inductor.

14. The self-tuning impedance-matching circuit of claim 13, wherein the plurality of actuator electrodes comprises first and second comb actuators coupled to the first tunable reactance element.

15. A circuit comprising:
an antenna;
a plurality of channels connected to the antenna, each having a different frequency;
a first self-tuning circuit in series with at least one of the plurality of channels; and
a second self-tuning parallel circuit connected between adjacent ones of the plurality of channels,
wherein at least one of the first and second self-tuning circuits is directly or indirectly electromagnetically coupled to the antenna, and comprises
a first tunable reactance element connected to a first mechanical spring and having a tunable reactance;
a second tunable or fixed reactance element;
one or more electrical connections between the first tunable reactance element and the second reactance elements; and
an AC signal source configured to (i) provide an AC signal to the first tunable reactance element and second reactance elements, the AC signal having a frequency, and (ii) create an electromagnetic force on the first tunable reactance element that moves the first tunable reactance element and tunes the self-tuning impedance-matching circuit toward resonance with the AC signal, wherein one of the first tunable reactance element and second reactance elements comprises a capacitor and the other of the first tunable reactance element and second reactance elements comprises an inductor.

16. The circuit of claim 15, comprising a plurality of the first self-tuning circuits, each in series with a unique one of the plurality of channels, and a plurality of the second self-tuning parallel circuits connected between first and second adjacent ones of the plurality of channels, wherein each of the first and second self-tuning circuits comprises the first tunable reactance element, the second tunable or fixed reactance element, the one or more electrical connections, and the AC signal source.

17. A circuit comprising:
an antenna;
an energy storage device comprising a battery or a capacitor; and
at least one self-tuning microelectromechanical impedance-matching circuit, directly or indirectly electromagnetically coupled to the antenna and/or the energy storage device, comprising
a first tunable reactance element connected to a first mechanical spring and having a tunable reactance;
a second tunable or fixed reactance element;
one or more electrical connections between the first tunable reactance element and the second reactance elements; and
an AC signal source configured to (i) provide an AC signal to the first tunable reactance element and the second tunable or fixed reactance element, the AC signal having a frequency, and (ii) create an electromagnetic force on the first tunable reactance element that moves the first tunable reactance element and tunes the self-tuning impedance-matching circuit toward resonance with the AC signal,
wherein one of the first tunable reactance element and the second tunable or fixed reactance element comprises a capacitor, the other of the first tunable reactance element and the second tunable or fixed reactance element comprises an inductor, and the energy storage device is configured to store electromagnetic energy from the antenna and the self-tuning microelectromechanical impedance-matching circuit.

18. The circuit of claim 17, wherein the at least one self-tuning microelectromechanical impedance-matching circuit comprises a first self-tuning microelectromechanical impedance-matching circuit in series with the energy storage device and a second self-tuning microelectromechanical impedance-matching circuit in parallel with the energy storage device, and each of the first and second self-tuning microelectromechanical impedance-matching circuits comprises the first tunable reactance element, the second tunable or fixed reactance element, the one or more electrical connections, and the AC signal source.

19. A circuit comprising:
an energy storage device comprising a battery or a capacitor;
a piezoelectric energy harvester; and
at least one self-tuning microelectromechanical (MEMS) impedance-matching circuit, directly or indirectly electromagnetically coupled to the piezoelectric energy harvester and/or the energy storage device, comprising
a first tunable reactance element connected to a first mechanical spring and having a tunable reactance;
a second reactance element, wherein the second reactance element is tunable or fixed;
one or more electrical connections between the first tunable reactance element and the second reactance element; and
an AC signal source configured to (i) provide an AC signal to the first and second reactance elements, the AC signal having a frequency, and (ii) create an electromagnetic force on the first tunable reactance element that moves the first tunable reactance element and tunes the self-tuning impedance-matching circuit toward resonance with the AC signal,
wherein one of the first tunable reactance element and the second reactance element comprises a capacitor, the other of the first tunable reactance element and the second reactance element comprises an inductor, and the energy storage device is configured to store electromagnetic energy from the piezoelectric energy harvester and the self-tuning MEMS impedance-matching circuit.

20. The circuit of claim 19, wherein the at least one self-tuning MEMS impedance-matching circuit comprises a first self-tuning MEMS impedance-matching circuit in series with the energy storage device and a second self-tuning MEMS impedance-matching circuit in parallel with the energy storage device, and each of the first and second self-tuning MEMS impedance-matching circuits comprises the first tunable reactance element, the second tunable or fixed reactance element, the one or more electrical connections, and the AC signal source.

* * * * *